United States Patent [19]

Nusinov et al.

[11] Patent Number: 5,381,454
[45] Date of Patent: Jan. 10, 1995

[54] CIRCUIT AND METHOD OF RESETTING A DATA COMPRESSOR/DECOMPRESSOR

[75] Inventors: Eugene B. Nusinov, Sharon; James A. Pasco-Anderson, Needham, both of Mass.

[73] Assignee: Motorola, Inc., Schaumburg, Ill.

[21] Appl. No.: 123,553

[22] Filed: Sep. 20, 1993

[51] Int. Cl.⁶ .......................................... H03K 21/10
[52] U.S. Cl. ........................................ 377/39; 377/56
[58] Field of Search ..................................... 377/39, 56

[56] References Cited

U.S. PATENT DOCUMENTS

| | | | |
|---|---|---|---|
| 3,930,144 | 12/1975 | Tanaka | 377/44 |
| 4,216,530 | 8/1980 | Yamaki et al. | 377/20 |
| 4,756,013 | 7/1988 | Van Veldhuizen | 377/39 |
| 4,780,895 | 10/1988 | Paul | 377/39 |
| 5,221,906 | 6/1993 | Hayashi et al. | 377/39 |

*Primary Examiner*—John S. Heyman
*Attorney, Agent, or Firm*—Robert D. Atkins

[57] ABSTRACT

A data compressor generates codewords representative of the location and length of a string match between an input data stream and a CAM array vocabulary table. A data decompressor looks up the codewords for a string match in its vocabulary table. The CAM array is arranged in a serpentine configuration to reduce track layout. A column priority encoder reverses the priority of alternate rows to maintain the logical flow through the CAM array. The CAM array uses a flipflop with a common control circuit to transfer data through the flipflop. When the data compressor is reset, the CAM array may locate matches in the unused portion which are interpreted as the reset character. A barrel shifter in the data compressor converts variable length codewords into fixed length for transmission. A barrel shifter in the data decompressor converts fixed length codewords back into variable length for decoding into the vocabulary table.

2 Claims, 14 Drawing Sheets

CIRCUIT AND METHOD OF RESETTING A DATA COMPRESSOR/DECOMPRESSOR

CROSS REFERENCE TO RELATED PATENT APPLICATIONS

The present application is related to copending U.S. patent application Ser. No. 08/123,551, entitled "CIRCUIT AND METHOD OF INTERCONNECTING CONTENT ADDRESSABLE MEMORY", filed Sep. 20, 1993, by Eugene B. Nusinov et al and assigned to the same assignee, Codex, Corp.

The present application is further related to copending U.S. patent application Ser. No. 08/123,550, entitled "CIRCUIT AND METHOD OF BIT-PACKING AND BIT-UNPACKING USING A BARREL SHIFTER", filed Sept. 20, 1993, by Eugene B. Nusinov et al and assigned to the same assignee, Codex, Corp.

The present application is further related to copending U.S. patent application Ser. No. 08/123,548, entitled "FLIPFLOP AND CONTROL CIRCUIT IN A CONTENT ADDRESSABLE MEMORY", filed Sep. 20, 1993, by Eugene B. Nusinov et al and assigned to the same assignee, Codex, Corp.

The present application is further related to copending U.S. patent application Ser. No. 07/976,298, Attorney's Docket CX089101, entitled "AN ASSOCIATIVE CAM APPARATUS AND METHOD FOR VARIABLE LENGTH STRING MATCHING", filed Nov. 13, 1992, by Brian Ta-Cheng Hou et al and assigned to the same assignee, Codex, Corp.

BACKGROUND OF THE INVENTION

The present invention relates in general to data compression schemes and, more particularly, to the compression and decompression of data following the resetting of vocabulary tables.

Data compression schemes are well known in the art for encoding a stream of digital data signals into compressed digital data. Data compression generally refers to a process of inputting the data stream in a standard format, say 8-bit ASCII characters, and outputting the same information in a compressed format with fewer bits than the original format.

The compressing process is advantageous when considering data storage and data transmission. If the data is compressed into fewer total bits that represent the same information, then less space is required in the mass storage device. Likewise, data transmission occurs more rapidly when fewer bits are transmitted. In general by reducing the total number of ones and zeroes, data becomes more efficient to handle. When the time comes to use the data, it must be decompressed back into its original format for use by the end device.

One common compression technique is described in U.S. Pat. No. 5,003,307. The compression system includes a data compressor, a data decompressor and an interconnecting medium such as a transmission link or a mass storage device. Uncompressed data words are serially processed through the data compressor which builds a compressor vocabulary table comprising a history of incoming data and which sends a sequence of codewords across the transmission link, or to the mass storage device, to the data decompressor. The codewords are serially processed through the data decompressor to build a corresponding decompressor vocabulary table and provide uncompressed data words to the end device.

In the data compressor, each incoming data word is compared to the existing vocabulary table. If no match is found, the data compressor sends the data word as part of a codeword across the transmission link, or to the mass storage device, and further places the data word at the end of the vocabulary table. No actual data compression occurs if no match is found. The transmission capacity needed to send an uncompressed data word may be ten bits: eight bits for the uncompressed data weird and two bits, say "00", to represent the "length" of the matched string of data words-in this case zero.

If on the other hand one or more matches are found in the vocabulary table, the data compressor notes the locations of the matches in the vocabulary table. No data is sent initially but the incoming data is still added to the end of the vocabulary table. The next incoming data word is checked for a match to the contents of the next locations in the vocabulary table following the first matches, effectively searching for length-two string matches in the vocabulary table. If the second incoming data word fails to match the contents of the next locations, the length of the longest matched string is determined to be one. The first match may be conveyed as a codeword that contains the uncompressed data word as in the case when no match is found. The transmission capacity needed to send a codeword that conveys a length-one matched string may be ten bits: eight bits for the uncompressed data word and two bits, say "01", to represent the length of the matched string of data words—in this case one. Alternately, the "location" of a length-one match in the vocabulary table may be sent. Since typical implementations use vocabulary tables containing at least 1024 locations, which require at least 10-bits to represent, it is often preferable to include the 8-bit length-one match data word as the codeword.

If the second incoming data word matches the contents of at least one of the next locations, the process continues until a subsequent data word fails to match any of the next locations in the vocabulary table. The data compressor notes the number of such matches in the vocabulary table. A codeword is sent identifying the location of the first match and the length of the matched string of data words. Thus, if successive incoming data words "A", "B", "C" happen to match the same previously stored data string, the resulting codeword would have the starting location to the match of "A" and a length of three.

The transmission capacity needed to send the codeword depends on the number of bits required to represent the length and location fields. As is well known in the art, the size of the location field is typically determined by either the current number of entries in the vocabulary table or by the maximum size of the vocabulary table. The size of the length field is typically chosen to vary according to a prefix code wherein more probable length values are uniquely encoded using fewer bits with respect to less probable length values. For example, the size of the codeword that represents the length-three string "ABC" may also be ten bits: seven bits to convey the location in the vocabulary table (that contains less than 128 locations) and three bits which encode the length of the match, say "101". The data compressor releases one 10-bit codeword representative of the entire character string for transmission and/or storage. One 10-bit codeword requires less space to store and less time to transmit as compared to three individual uncompressed data words (24-bits). Thus when string matches of length greater than one are found, the data compressor offers the feature of transmitting or storing fewer total bits to represent the same information as compared to uncompressed formats.

On the decompression side, the data decompressor receives the sequence of codewords from the data compressor by transmission link or from a mass storage device. The data decompressor begins to build its own vocabulary table from the incoming compressed data. Codewords beginning with "00" are taken as containing uncompressed data words which are provided directly to the end device and are added to the end of the decompressor vocabulary table. Other codewords containing location and length fields are converted to standard format by reading the designated string from the vocabulary table. These data words are further added to the end of the vocabulary table and sent to the end device.

The aforedescribed data compressor may include a content addressable memory (CAM) to hold its vocabulary table. Each CAM array memory cell is individually addressable with read/write capability. Each incoming data word is compared in parallel to the existing contents of the CAM array and is sequentially placed in the next available CAM array memory cell. Once the CAM array reaches capacity, the addressing wraps around to the beginning of the array, thereafter overwriting the contents of the oldest CAM array memory cell.

When the CAM array is initially power-on, or reset due to some error conditions, the CAM cell typically contains the reset character, e.g. the binary value "00000000", as described in U.S. Pat. No. 5,130,993. The CAM array may be initialized simultaneously during one or a few clock cycles, or may be loaded from a separate RAM in several cycles. The incoming data words begin filling the CAM array as described. A problem may occur when an incoming data word happens to be the same as the reset character. The CAM array will find a match in its unused portion and encode the data word accordingly. The data decompressor typically uses vocabulary RAM 36 to build its own local vocabulary table . Thus, unless the vocabulary RAM 36 is initialized to the same reset character as the CAM array, the decompression will yield an error when the codeword attempts to lookup the character in the unused and uninitialized portion of the decompressor vocabulary table.

One option is to allow matches to occur in the unused portion of the CAM array storing the compressor vocabulary table and to initialize the decompressor vocabulary table in the vocabulary RAM 36 to match the CAM array preset. However, when the vocabulary RAM 36 is external to the IC chip, it can typically be written only one addressable location at a time. Therefore, the initialization process of the decompressor vocabulary table in external RAM is slow compared to the CAM array preset.

A second option is to inhibit matches in the unused portion of the CAM array storing the compressor vocabulary table. The logic necessary to inhibit matches in the unused portion of the compressor vocabulary table complicates the design and increases the size of the CAM array. As the compression progresses and more of the CAM array is filled, such logic would need to adapt to inhibit a decreasing number of matches, which requires extensive circuitry.

Hence, a need exists to allow matches of incoming data words in the unused portion of the CAM array while ensuring proper decoding in the decompressor.

SUMMARY OF THE INVENTION

Briefly stated, the invention comprises a first counter for storing and incrementing a first address value. A second counter stores and increments a second address value. A comparator has first and second inputs receiving the first and second address values respectively and having an output providing e first control signal. A first multiplexer includes a first input receiving a first data signal, a second input receiving a second data signal, a control input coupled to the output of the comparator, and an output passing the first data signal upon receiving a first state of the first control signal and the second data signal upon receiving a second state of the first control signal.

In another aspect, the present invention is a method of detecting a first address signal out a CAM array comprising the steps of storing a first address value, storing a second address value, comparing the first and second address values and providing a first control signal having a first state when the first and second address values are equal and a second state otherwise, and selecting between first and second data signals based on the first control signal where the first state of the first control signal selects the first data signal and second state of the first control signal selects the second data signal.

DETAILED DESCRIPTION OF THE PREFERRED EMBODIMENT

Figure 1:
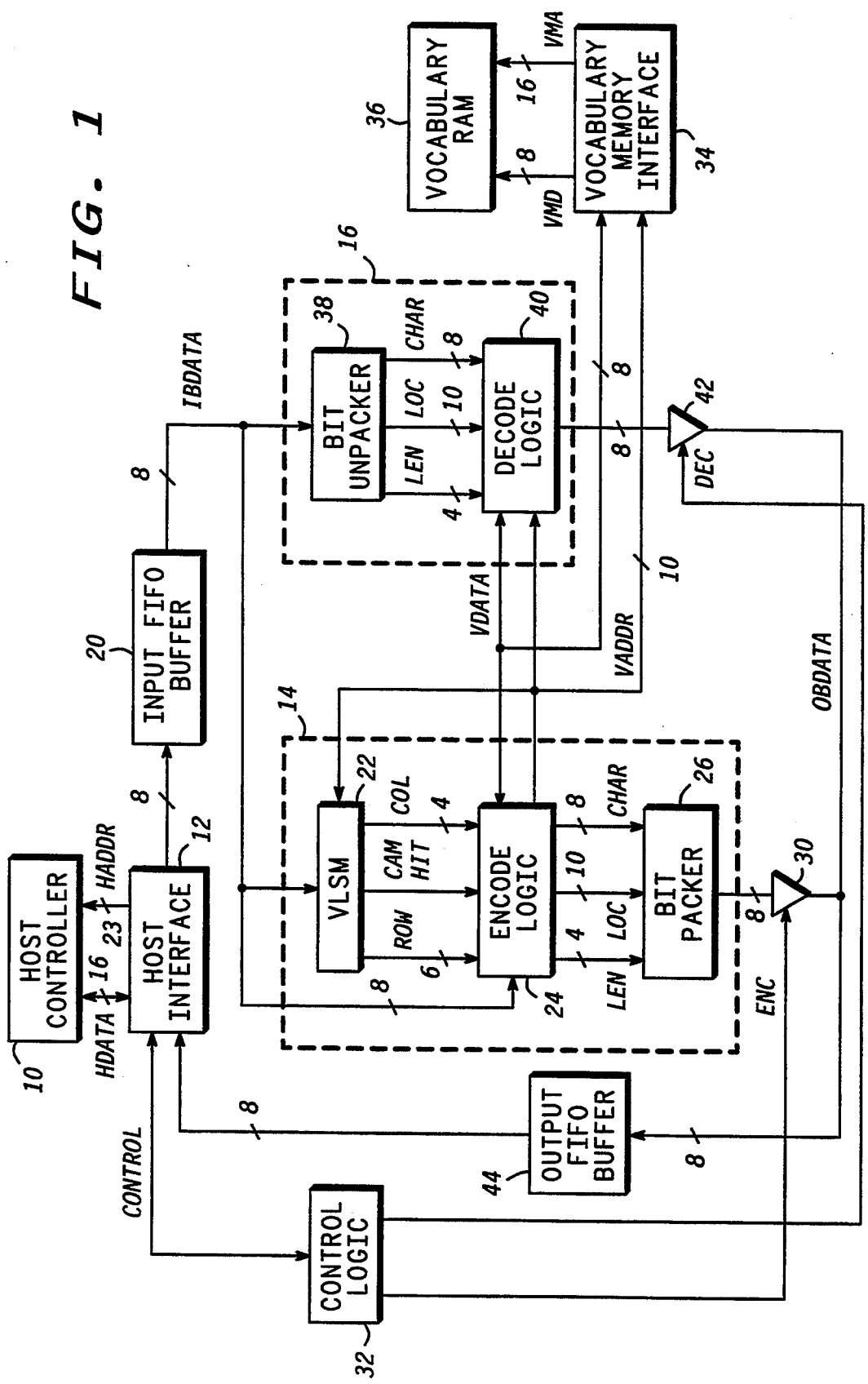
FIG. 1 is a block diagram illustrating a data compressor and data decompressor.

Referring to FIG. 1, host controller 10 provides 16-bit data words HDATA to host interface 12 which controls the flow of data between host controller 10 and data compressor 14 and data decompressor 16. HADDR (host address) addresses the memory location in host controller 10 for reading and writing HDATA. After reading data, host interface 12 places the data into input FIFO (first-in-first-out) buffer 20 one 8-bit segment at a time. The incoming data shifts along input FIFO buffer 20 to its output. The data from input FIFO buffer 20, i.e. IBDATA (input bus data), is applied to data compressor 14 and to data decompressor 16 for compression or decompression.

The compressing process is advantageous when considering data storage and data transmission, especially in computer network systems. If the data is compressed into fewer total bits to represent the same information, then less space is required in mass storage devices. Likewise, data transmission occurs more rapidly with fewer bits transmitted.

For data compression, the uncompressed data words are sequentially processed through VLSM (variable length string matcher) 22 which updates a local vocabulary comprising a history of all recent incoming data words in an internal 1024-cell associative CAM (content addressable memory) array. VLSM 22 searches for the longest string of matches between the incoming IBDATA and data words already stored in the existing vocabulary table in the CAM array. If no match is found, encode logic 24 obtains the uncompressed data word from IBDATA and updates the vocabulary table located in the CAM array. VADDR (vocabulary address) from encode logic 24 provides the update location in the CAM array. Encode logic 24 also sends the uncompressed CHAR (character) signal derived directly from IBDATA to bit packer 26. A LEN (length of match) signal of zero identifies the data as uncompressed to bit packer 26. The transmission capacity needed to send an uncompressed data word is ten bits: eight bits for the uncompressed data word and two bits for the length code, say "00".

If one or more matches are found between the incoming data word and the vocabulary table, VLSM 22 retains the locations of those matches. No data is sent at this time but the incoming data is still added to the end of the vocabulary table in the CAM array. VLSM 22 signals encode logic 24 via the CAM_HIT signal when each data word match is found. Encode logic 24 keeps track of the number of consecutive matches found (LEN) in a 4-bit length counter (not shown) incremented by CAM_HIT. The next incoming data word is checked for a match to the contents of the next locations in the vocabulary table following the first matches, effectively searching for length-two string matches in the vocabulary table. The process continues until a subsequent data word fails to match any of the next locations in the vocabulary table.

If successive incoming data characters, say "A" and "B", happen to match the same previously stored data string, then the resulting codeword is assigned the corresponding start location in the CAM array and a length of two. VLSM 22 passes 6-bit ROW and 4-bit COL signals identifying the location of the most recent match in the vocabulary table to encode Logic 24. Encode logic 24 combines the ROW and COL signals into a 10-bit LOC signal indicating the start location in the vocabulary table of the longest string match. The start location is derived by subtracting LEN from the most recent match. Encode logic 24 may simultaneously update a duplicate copy of the vocabulary table located in vocabulary RAM 36 via vocabulary memory interface 34. Busses VDATA and VADDR provide the data word value and the location to be updated, respectively.

The transmission capacity needed to send a codeword representing compressed data varies depending on the number of bits required to represent the length and location codes. The size of the location code is typically determined by either the current number of entries in the vocabulary table or by the maximum size of the vocabulary table, as described. The size of the length code is typically chosen to vary according to a prefix code wherein more probable length values are uniquely encoded using fewer bits with respect to less probable length values.

Bit packer 26 derives variable-length codewords from fixed-length inputs LEN, LOC and CHAR and packs them into a sequence of 8-bit bytes suitable for output FIFO buffer 44. The 10-bit LOC signal is converted to a variable-length location code that varies in size from five to ten bits, depending on the number of used locations in the vocabulary table, see FIG. 12 and associated text infra. For example, as the number of used locations exceeds 31, 63, 127, 255 and 511, the size of the location code adapts from five-to-six-to-seven-to-eight-to-nine-to-ten bits, respectively. The 4-bit LEN signal is encoded into a variable-length length code that varies in size from two to five bits, see FIG. 12 and associated text infra. Thus, the length and location of the longest matched string combine as a variable-length codeword to represent the data in compressed format. The codeword conveys the location of the beginning of the Longest string match in the vocabulary table and the number of consecutive matching characters from that starting point. A control signal ENC from control circuit 32 enables tri-state buffer 30 to pass the outgoing data as OBDATA through output FIFO buffer 44 to host interface 12. Host interface 12 sends the data to host controller 10 for storage, or other transmission as necessary. The data compressor thus transmits fewer total bits when matches are found as compared to uncompressed formats. The savings in required mass storage space and/or data transmission time for compressed data can be significant.

For the data decompression path, bit-unpacker 38 parses the incoming compressed 8-bit IBDATA into a sequence of alternating length and location codes or length codes and uncompressed data words. Bit-unpacker 38 decodes the variable-length codes and alternately generates fixed-length fields LOC and LEN, or CHAR and LEN. LEN and LOC are converted to VADDR and sent by way of vocabulary memory interface 34 to retrieve the appropriate number of data words from vocabulary RAM 36. VMA is the vocabulary memory address into vocabulary RAM 36, and VMD is the vocabulary memory data read to and written from vocabulary RAM 36. The data from vocabulary RAM 36 returns to decode logic 40 for outputting to output FIFO buffer 44 and for updating the decompressor vocabulary table stored in vocabulary RAM 36. When LEN is zero, decoder logic 40 obtains the data word directly from CHAR without reading from vocabulary RAM 36 since it is an uncompressed data word. For every data word written to output. FIFO buffer 44, decoder logic 40 simultaneously updates the decompressor vocabulary table located in vocabulary RAM 36 via vocabulary memory interface 34. A control signal DEC from control circuit 32 enables tri-state buffer 42 to pass the uncompressed data word through output FIFO buffer 44 as OBDATA (output bus data). Host interface 12 sends OBDATA to host controller 10 for storage or further transmission.

Applications for single and multiple channel data compression vocabularies are disclosed in U.S. Pat. No. 5,245,614 and is hereby incorporated by reference. Each input stream of digital data signals that is processed by a corresponding pair of compression and decompression vocabulary tables are referred to as a channel. In the case of a single channel data compression application, the CAM array provides the only compressor vocabulary table. In the case of a single channel data decompression application, vocabulary RAM 36 need contain the only decompression vocabulary table.

A different situation exists in the case of a multiple channel data compression and decompression application. In the latter case, the information from multiple channels may be transmitted in frames of data that are multiplexed. Each frame may include information regarding compression status and relationship to previous frames, e.g. channel information. When building a vocabulary table related to one particular frame, it is desirable to save that history for later use on subsequent frames from the same channel. That way if data compressor 14 is processing one or more frames using a first vocabulary table located within the CAM array and then receives a frame to be compressed using a second vocabulary table, the first vocabulary table may be saved in vocabulary RAM 36 and the second vocabulary table may be loaded into the CAM array. When a data frame arrives to be compressed using the second vocabulary table, the CAM array is reset and reloaded from the second vocabulary table stored in vocabulary RAM 36, effectively allowing VLSM 22 to continue processing where the first channel left off. This saves rebuilding the vocabulary table from scratch each time a frame from a different channel arrives for compression.

To accomplish the loading and unloading, VLSM 22 and encode logic 24 are connected through vocabulary memory interface 34 to vocabulary RAM 36. VLSM 22 may store characters in the local CAM array and completely update the corresponding instance of the vocabulary table stored in vocabulary RAM 36 from the CAM array when a frame from a different channel arrives. Another option is to update both the CAM array and vocabulary RAM 36 continuously as each data word is processed through VLSM 22 and encoder logic 24.

Figure 2:
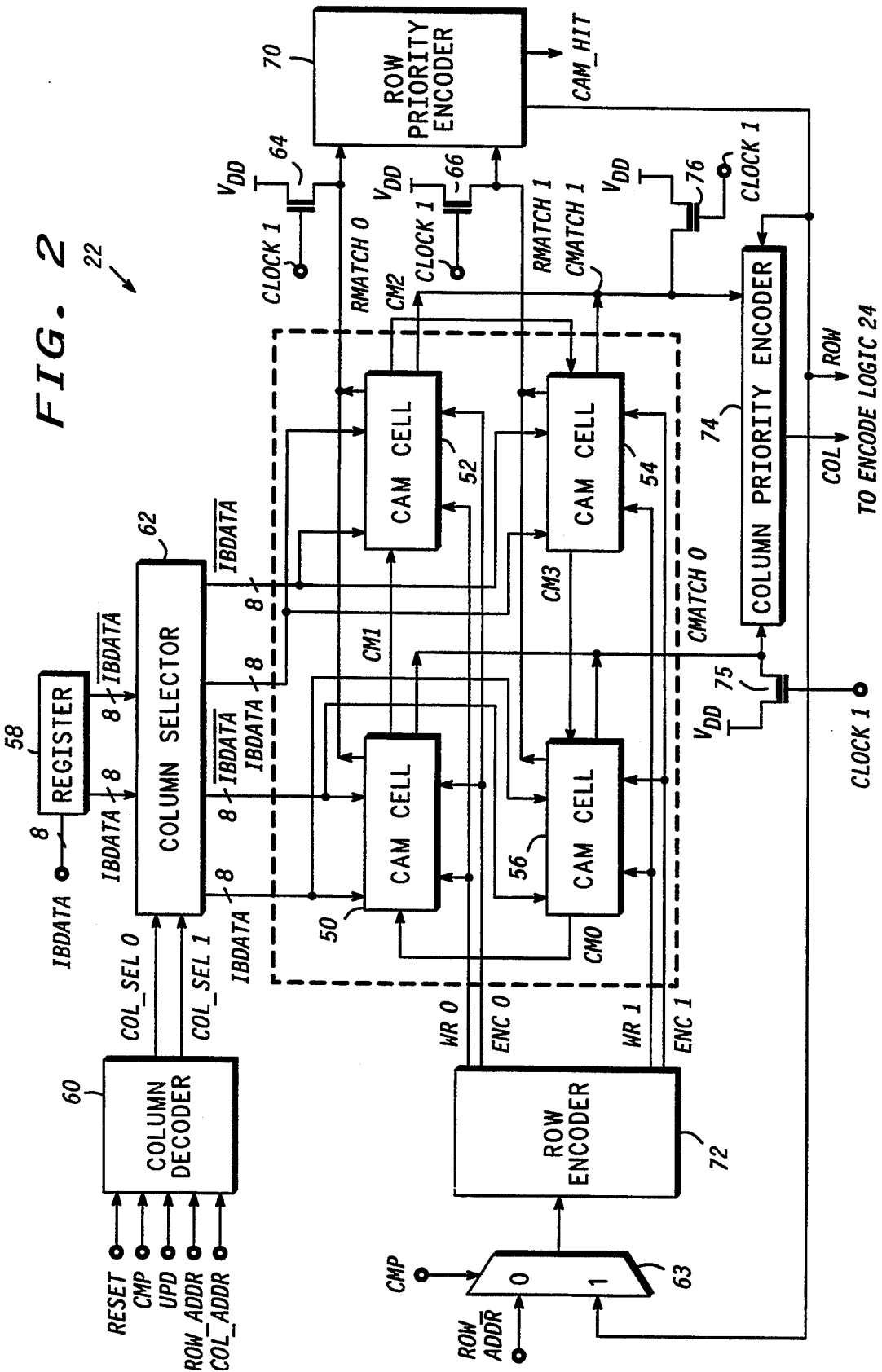
FIG. 2 is a block diagram illustrating the variable length string matcher of FIG. 1.

VLSM 22 is shown in FIG. 2 as a simplified 2×2 CAM array with CAM cells 50, 52, 54 and 56. In practice, CAM cell array 50-56 may be sixty-four rows with sixteen cells in each row for a total of 1024 cells. The operation of a full-size CAM array follows directly from the following example of the 2×2 CAM array. VLSM 22 receives uncompressed incoming data words IBDATA and checks for matches in the local vocabulary stored in CAM cells 50-56 which comprise a history of previous data. Register 58 stores IBDATA for use by the CAM array. The matching process includes a series of alternating compare and update phases. The INIT, CM and UPD control signals originate from the state machine (not shown) in encoder logic 24. A logic one CMP is asserted for the compare phase, and a logic one UPD is asserted for the update phase. The UPD and CMP control signals are mutually exclusive. The compare and update process continues until no more matches are found, or until a predefined maximum number of matches is reached, i.e. VLSM 22 has found the longest consecutive string of matches between the incoming data words and the contents of the vocabulary table. INIT initializes CM0-CM3 signals to logic zero at the beginning of each string match search. CAM_HIT from row priority encoder 70 signals encoder logic 24 each time a match is found.

Consider the data character string "A", "B", "A", "B", and "C" chronologically sent to VLSM 22. Assume the CAM array has been initialized to zero. During the first compare phase with the first data word "A", column decoder 60 enables column selector 62 to pass IBDATA and its complement $\overline{\text{IBDATA}}$ to all CAM cells 50-56 simultaneously. That is, every CAM cell in every column is enabled to compare the incoming data word "A" with the contents of the CAM array. The first character "A" finds no match in CAM cells 50-56 during the first compare phase since the CAM array was initially empty. Control signals CM0, CM1, CM2 and CM3 (cell match) are logic zero indicating no match to the next CAM cell. Output signal CAM_HIT remains inactive.

Next, a logic one control signal UPD (update) activates the update phase. The data word "A" is placed in the next available location, i.e. CAM cell 50, during the update phase. An external counter (not shown) in encoder logic 24 keeps track of the next available location in the CAM cell array and provides its address as VADDR (vocabulary address). VLSM 22 splits VADDR into ROW_ADDR (row address) and COL_ADDR (column address). ROW_ADDR represents the most significant bits and COL_ADDR represents the least significant bits of the address of the next available location. For the update phase, COL_ADDR and ROW_ADDR control column selector 62 to enable one particular column, see FIG. 3 and associated text infra. The CMP signal is logic zero during the update phase to control multiplexer 63 and pass ROW_ADDR which enables a write operation to the proper row with control signal WR0 (write row). The WR1 control signal enables writing to CAM cells 54 and 56 when activated. The row and column address thus provides for the update of the data word "A" into CAM cell 50.

Since there was no match, the first data word "A" is also sent to encode logic 24 for transmission to host controller 10 in uncompressed format. A 2-bit length code "00" is sent to identify "A" as uncompressed data. Likewise, the first "B" finds no match in the CAM array and is placed in CAM cell 52. The data word "B" is also sent to encode logic 24 for transmission to host controller 10 in uncompressed format. The CAM array now has a vocabulary history of "A" and "B" in CAM cells 50 and 52, respectively.

When the third data word "A" arrives, column decoder 60 again enables column selector 62 to pass IBDATA and its complement $\overline{\text{IBDATA}}$ to all CAM cells 50-56 simultaneously. Transistors 64 and 66 precharge RMATCH0 and RMATCH1 to logic one each high state of CLOCK1. The row of CAM cells containing a match are indicated by logic zero for RMATCH0 and/or RMATCH1 (row match). CAM cell 50 detects a match between the incoming data word "A" and the previously stored "A". The CM1 signal goes to logic one and is stored in CAM cell 52. The control signals CM0, CM1, CM2 and CM3 pass along the status of a match in the previous CAM cell to the next logical CAM cell. A match in CAM cell 50 activates control signal CM1 to CAM cell 52, while a match in CAM cell 52 activates control signal CM2 to CAM cell 54. A match in CAM cell 54 activates control signal CM3 to CAM cell 56, and a match in CAM cell 56 activates control signal CM0 to CAM cell 50. An alternate embodiment of CAM cells 50–56 would pass data signals instead of match status.

RMATCH0 is asserted because the incoming data word "A" matches the contents of CAM cell 50 in the first row. Row priority encoder 70 selects the least significant CAM row which indicates an active RMATCH. CAM row 50–52 is defined as less significant than CAM row 54–56. If RMATCH0 is asserted at logic zero, ROW is logic zero. If RMATCH1 is asserted at logic zero, and RMATCH0 is not asserted, ROW is logic one. If both RMATCH0 and RMATCH1 are both asserted, ROW is logic zero because RMATCH0 is less significant. Row priority encoder 70 outputs only one bit for the ROW address since the CAM array is only 2×2. For a full CAM array with sixty-four rows and 1024 total cells, ROW is a 6-bit address. Row priority encoder 70 also asserts CAM_HIT signal each time an RMATCH signal is asserted. An example of row priority encoder 70 may be found as Motorola part number MC14532B priority encoder.

The third data word "A" is also placed in CAM cell 54 to update the vocabulary table as described above. The ROW address from row priority encoder 70 is sent to row decoder 72 to select one of $2^n$ enable lines according to the ROW address, where "n" is the number of address bits. The ENC0 signal enables CAM row 50–52 because it is the least significant row having a match. The ENC0 signal also activates the CMATCH0 or CMATCH1 (column match) for the CAM cell having stored a CM match from the previous cell. Transistors 75 and 76 precharge CMATCH0 and CMATCH1 to logic one each CLOCK1 cycle. Thus far, the logic one from CM1 is stored in CAM cell 52.

The fourth data word "B" is compared to the contents of CAM cell 52 and another match is found. A logic one CM2 passes to CAM cell 54. RMATCH0 is again asserted at logic zero and row priority encoder 70 outputs a logic zero ROW address. The fourth data word "B" is placed in CAM cell 56.

Figure 5:
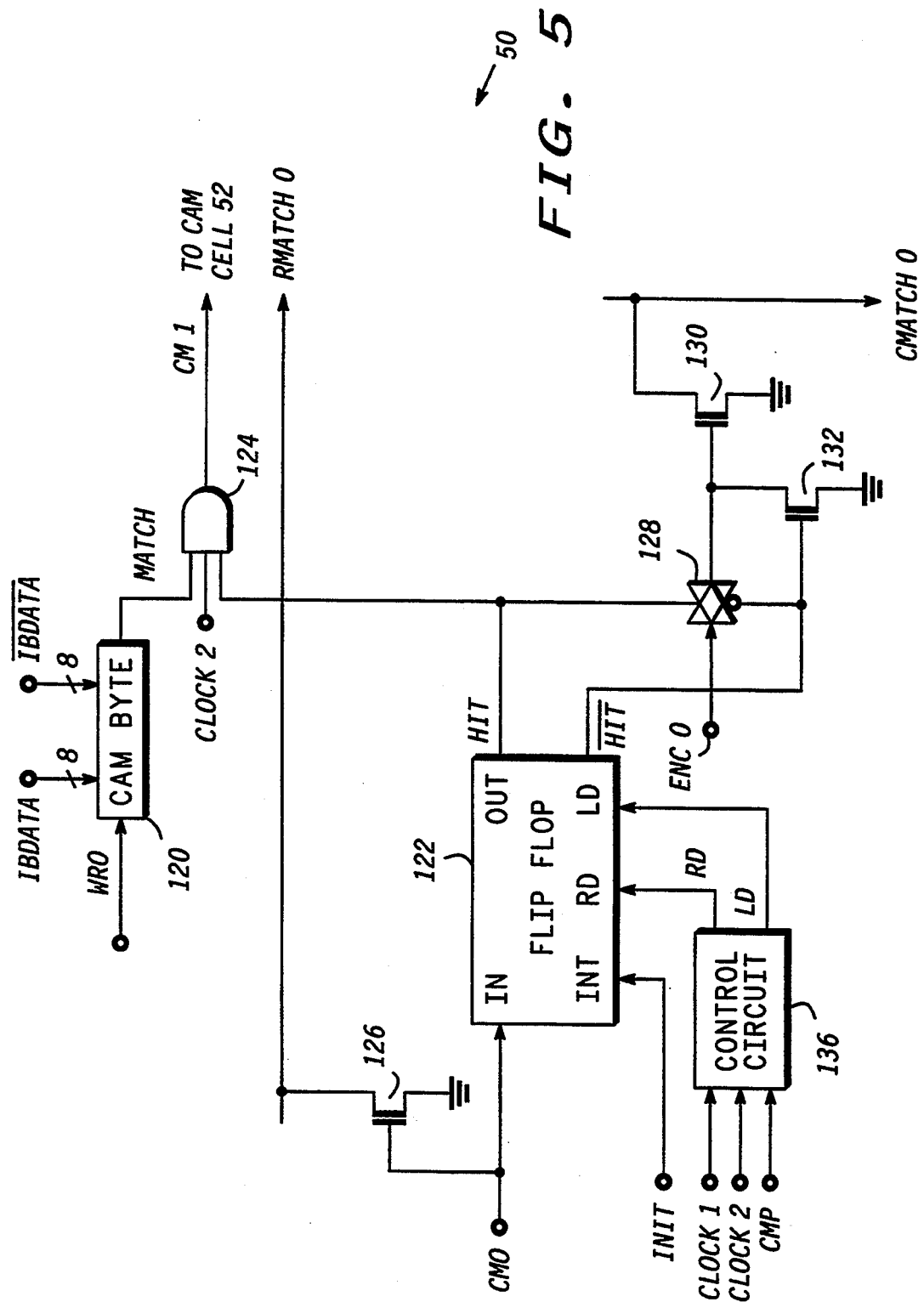
FIG. 5 is a schematic and block diagram illustrating the CAM cell of FIG. 2.

The ENC0 and ENC1 (encode) signals are actually utilized only if the next incoming data word fails to find a match, see discussion of CAM cell 50 with FIG. 5 infra. Otherwise, a subsequent match updates the ROW signal as per row priority encoder 70 and possibly changes the active ENC0 and ENC1 control signals. It is possible for two or more rows of the CAM array to each find a match with the first incoming data word. At that time, it is unknown which row contains the longest string match to the still to come data stream.

Once the next incoming data word "C" fails to match the next CAM cell 54, the most recent RMATCH and CMATCH provides row and column information of the location. In this example, RMATCH0 and CMATCH1 are asserted and the row priority encoder 70 and column priority encoder 74 produce ROW and COL, respectively, representing the address of CAM cell 52. The ROW and COL signals are passed to encode logic 24 to generate LEN and LOC. The combination of ROW and COL actually points to the last location in the string match. Encode logic 24 subtracts LEN from the ROW and COL address to find the starting address of the string match.

For the layout of the CAM array in an integrated circuit, the first row of interconnecting CAM cells are disposed on an IC in adjacent locations such that the CM line of one CAM cell is connected to the next CAM cell with minimal track routing. The logical flow of cell match signals CMi is from left to right, e.g. CAM cell 50 to CAM cell 52, through the CAM cells of the first row. A second row of CAM cells are disposed on the IC directly beneath the first row. Additional rows may be laid forming a two dimensional matrix. The logical flow of cell match signals CMi continues from right to left, e.g. CAM cell 54 to CAM cell 56, through the CAM cells of the second row. Thus, CAM cells 50–56 are respectively increasing in significance. The right-most CAM cell in the first row, e.g. CAM cell 52, is connected to the right-most CAM cell, e.g. CAM cell 54, in the second row thus minimizing track routing. Likewise, the left-most CAM cell in the second row is connected to the left-most CAM cell in the third row. The last CAM cell in the last row is connected to the left-most CAM cell in the first row, thereby completing the loop. The resulting serpentine interconnecting scheme has the advantage of minimizing track routing between CAM cells and simplifying the layout design.

Special consideration must be given to both column decoder 60 and column priority encoder 74. The least significant CAM cell in the even rows of the CAM array is the left-most cell. The least significant CAM cell in the odd rows of the CAM array is the right-most cell. Thus, priority is given to the less significant CAM cells in even rows and to the less significant CAM cells in odd rows. Yet the serpentine interconnecting scheme designates the next logical CAM cell following the right-most, most significant CAM cell in an even row to be the right-most, least significant CAM cell in an odd row. Moreover, the least significant CAM cell in the even row is coupled to the same CMATCH0 line as the most significant CAM cell in the odd row. Therefore, column priority encoder 74 must reverse the physical order of its inputs on every other row, see discussion regarding FIG. 8 infra. The least significant bit(s) of ROW from the row priority encoder 70 controls column priority encoder 74.

Figure 3:
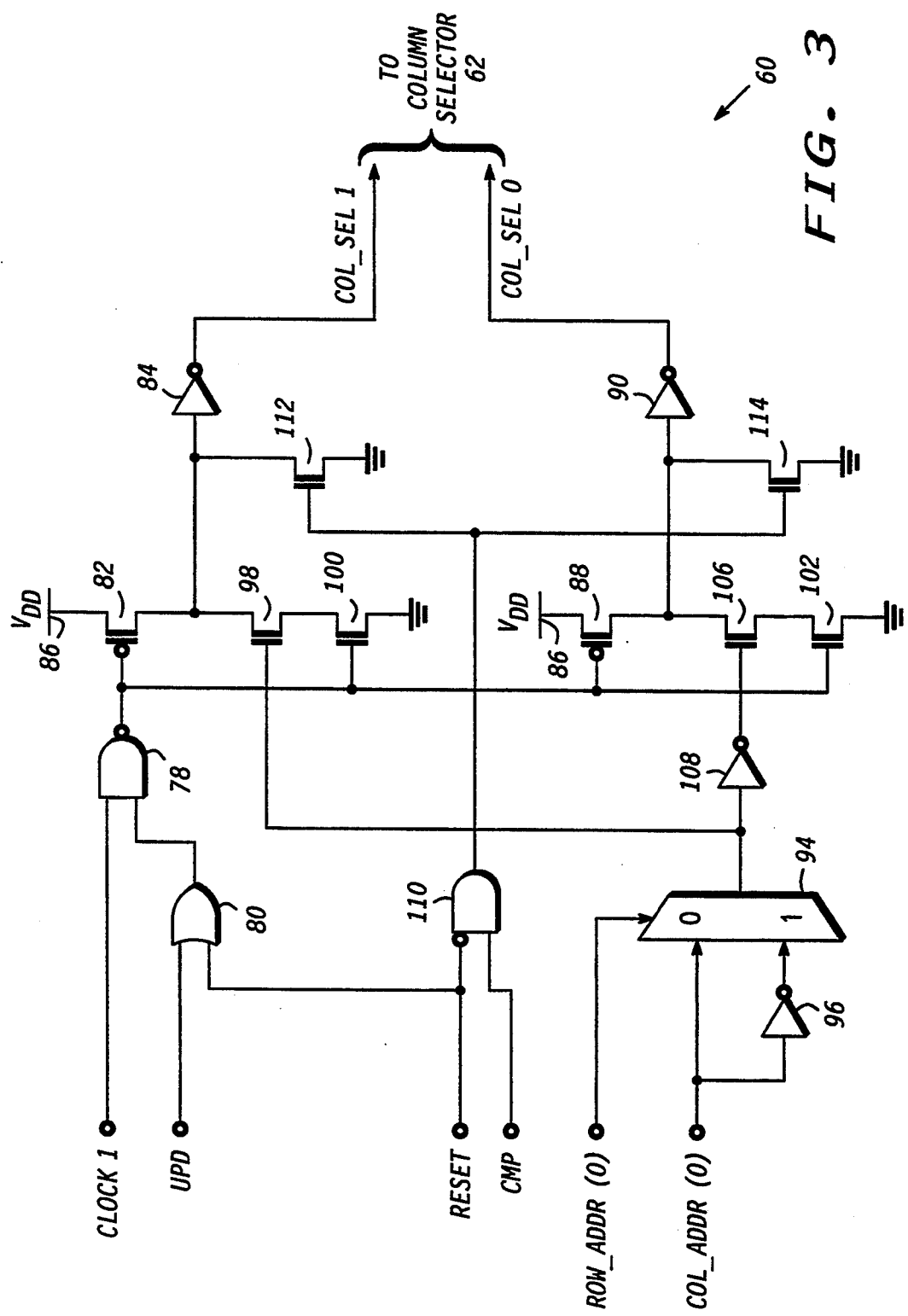
FIG. 3 is a schematic diagram illustrating the column decoder of FIG. 2.

Turning to FIG. 3, further detail of column decoder 60 is shown including NAND gate 78 receiving CLOCK1 as one phase of the system clock. The CLOCK1 and CLOCK2 signals are non-overlapping opposite phases of the system clock operating at say 20 MHz. An example of a circuit to generate the CLOCK1 and CLOCK2 clock signals from the main system clock is disclosed in U.S. Pat. No. 5,212,412 and hereby incorporated by reference. OR gate 80 receives UPD and RESET at its inputs for providing a second input to NAND gate 78. When RESET is asserted at logic one, the output of NAND gate 78 goes to logic zero at the high state CLOCK1 and turns on transistors 82 and 88 and turns off transistors 100 and 102. The input of inverter 84 and the input of inverter 90 become logic one by way of power supply conductor 86 operating at a positive potential such as $V_{DD}$. The COL_SEL1 signal et the output of inverter 84 and the COL_SEL0 signal at the output of inverter 90 become logic zero and disable transmission of IBDATA and $\overline{\text{IBDATA}}$ through column selector 62 to CAM cells 52 and 54 and to CAM cells 50 and 56, respectively.

The update of a CAM cell occurs during CLOCK2. CLOCK1 is thus logic zero to produce a logic one at the output of NAND gate 78. Transistors 100 and 102 are enabled by a logic one at the output of NAND gate 78. The least-significant bit of ROW_ADDR controls multiplexer 94 to pass COL_ADDR, or it s complement $\overline{\text{COL\_ADDR}}$ by way of inverter 96, to its output to select one column of the CAM array during the update phase. A logic one at the output of multiplexer 94 turns on transistor 98 and pulls the input of inverter 84 to logic zero and COL_SEL1 to logic one. Column selector 62 passes IBDATA and $\overline{\text{IBDATA}}$ to CAM cells 52 and 54. A logic zero at the output of multiplexer 94 turns off transistor 98 and turns on transistor 106 because of inverter 108. The input of inverter 90 goes to logic zero and COL_SEL becomes logic one to enable IBDATA and $\overline{\text{IBDATA}}$ to CAM cells 50 and 56.

For the compare phase, control signal CMP is logic one and RESET is logic zero to provide a logic one at the output of AND gate 110 and turn on transistors 112 and 114. The inputs of inverters 84 and 90 are pulled to logic zero. The COL_SEL0 and COL_SEL1 control signals go to logic one and enable IBDATA and $\overline{\text{IB}}$ DATA to pass through column selector 62 to all CAM cells 50–56.

Figure 4:
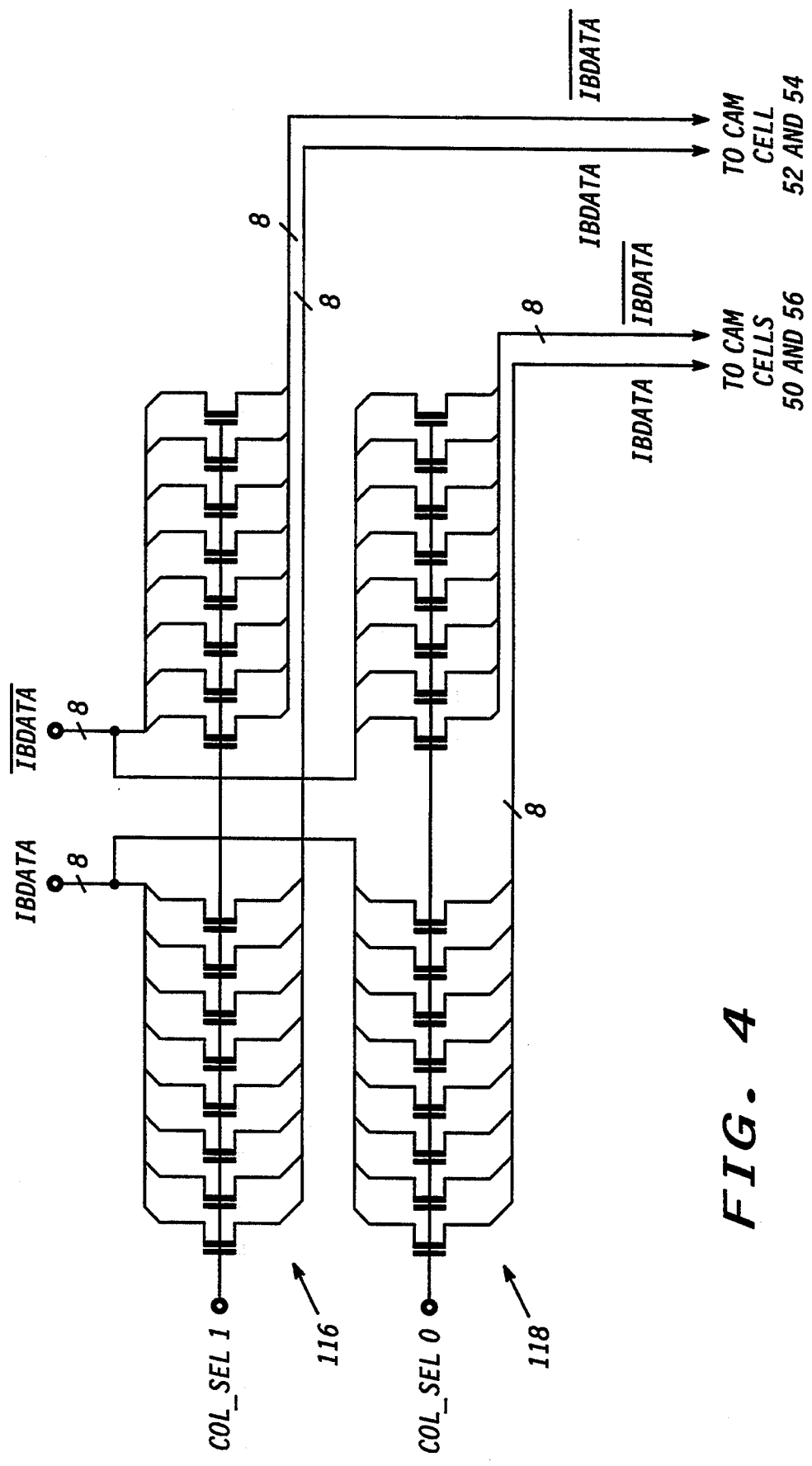
FIG. 4 is a schematic diagram illustrating the column selector of FIG. 2.

Column selector 62 is shown in FIG. 4. A logic one COL_SEL1 turns on transistor array 116 to pass IBDATA and $\overline{\text{IBDATA}}$ to CAM cells 52 and 54. A logic zero COL_SEL1 turns off transistor array 116 to block IBDATA and $\overline{\text{IBDATA}}$. A logic one COL_SEL0 turns on transistor array 118 to pass IBDATA and $\overline{\text{IB}}$ DATA to CAM cells 50 and 56. A logic zero COL_ SEL0 turns off transistor array 118 to block IBDATA and $\overline{\text{IBDATA}}$.

In FIG. 5, CAM cell 50 is shown as representative of the other CAM cells. An example of one of the eight bits of CAM byte 120 is disclosed in U.S. Pat. No. 4,538,243 and is hereby incorporated by reference. Briefly, CAM byte 120 performs a compare function between the IBDATA and its existing contents. If IBDATA matches the prior stored contents, MATCH is asserted to logic one. The CM1 control signal becomes asserted at logic one when MATCH, CLOCK2 and HIT from master-slave flipflop 122 are logic ones at the inputs of AND gate 124. CM1 goes to a flipflop like 122 in CAM cell 52. The CM0 control signal from CAM cell 56 enables transistor 126 to assert RMATCH0 as logic zero. A logic one HIT signal from flipflop 122 also enables transmission gate 128 to pass the ENC0 control signal from row decoder 72 to turn Dn transistor 130 and assert CMATCH0 as logic zero when ENC0 is active. When $\overline{\text{HIT}}$ is logic one, transmission gate 128 is disabled and transistor 132 turns on to hold transistor 130 off. Control circuit 136 provides control signals RD (read) and LD (load) to clock flipflop 122 as described below. Note only one control circuit 136 is used to send control signals LD and RD to flipflops like 122 in all CAM cells. CAM byte 120 stores IBDATA upon receiving a WR0 control signal. In an alternate embodiment, CAM byte 120 could output data instead of a match status signal.

All transmission gates described herein may be implemented as back-to-back P-channel and N-channel transistors (not shown) with their drains and sources coupled together, as is well known. The inverted input is the gate of the P-channel transistor, and the non-inverted input is the gate of the N-channel transistor.

Figure 6:
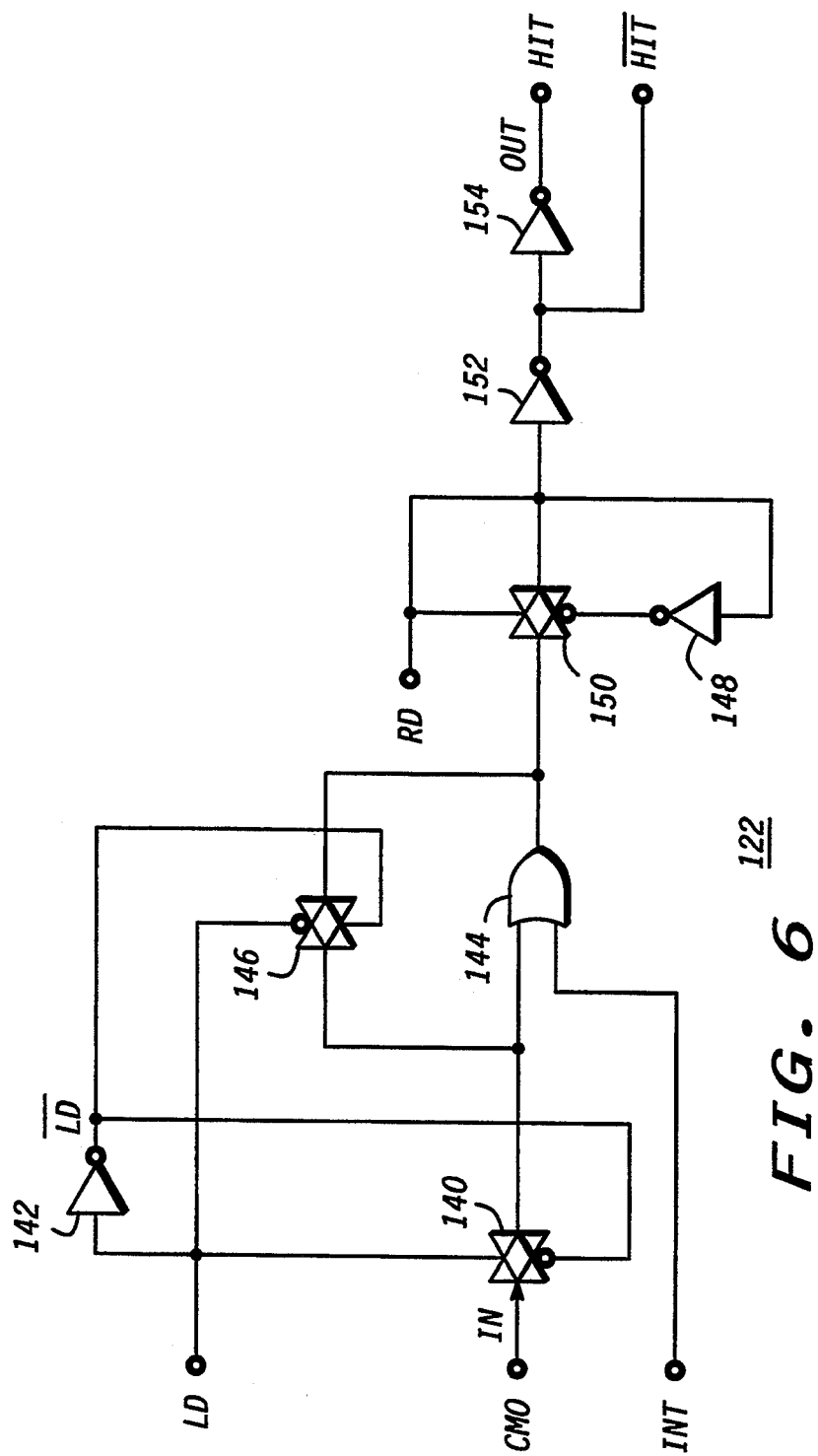
FIG. 6 is a schematic diagram illustrating the flipflop of FIG. 5.

Turning to FIG. 6, flipflop 122 is shown including transmission gate 140 receiving the CM0 control signal from CAM cell 56. The LD control signal and its complement $\overline{\text{LD}}$ through inverter 142 enable transmission gate 140. Either the CM0 control signal or an INIT (initialize) control signal from the state machine (not shown) in encoder logic 24 produces a logic one at the output of OR gate 144. INT is asserted to logic one at the beginning of each string match. Transmission gate 146 latches the logic one in place when LD and $\overline{\text{LD}}$ control signals change state to logic zero and logic one, respectively. The RD control signal and its complement $\overline{\text{RD}}$ through inverter 148 enables transmission gate 150 to pass the output state of OR gate 144 to inverters 152 and 154. $\overline{\text{HIT}}$ is taken at the output of inverter 152 while HIT is taken at the output of inverter 154. The LD signal loads the CM0 signal into the master section flipflop 122, e.g. circuit 140–146. The RD signal passes the stored logic state to the output of flipflop 122. The LD signal is asserted at logic one only during CMP and CLOCK2. The RD signal is asserted otherwise. Thus, RD and LD are mutually exclusive and non-overlapping. Flipflop 122 operates to store the match from the adjacent CAM cell generated during the previous compare phase. Therefore, a match detected in CAM byte 120 results in flipflop like 122 in CAM cell 52 storing a logic one from CM1.

Figure 7:
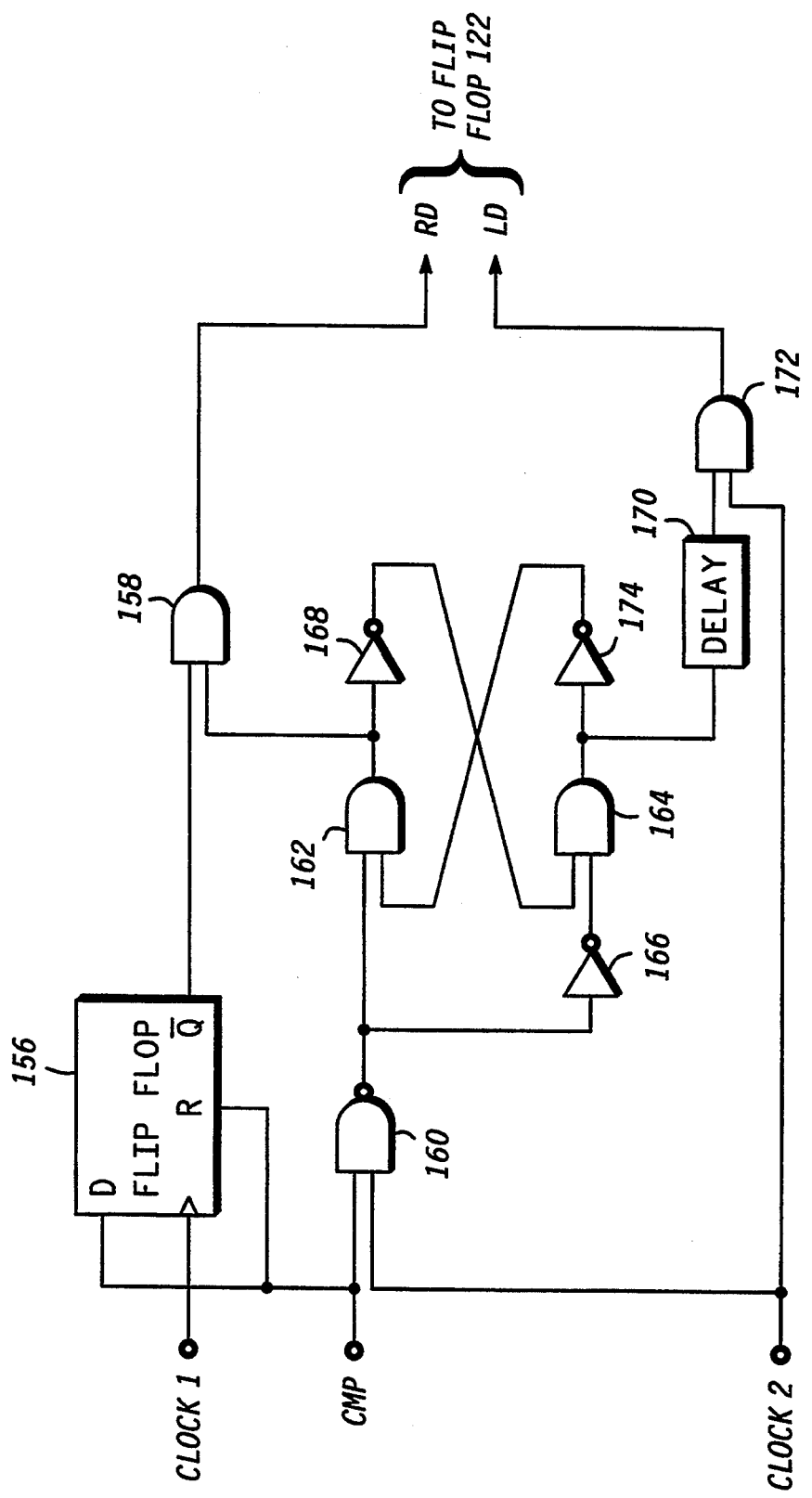
FIG. 7 is a schematic diagram illustrating the control circuit of FIG. 5.

FIG. 7 illustrates control circuit 136 receiving CMP, CLOCK1 and CLOCK2. Note that only one control circuit 136 is used to send control signals LD and RD to flipflops like 122 in all CAM cells. A D-type flipflop 156 receives CMP at its data and reset inputs and CLOCK1 at its clock input. The output of flipflop 156 is applied to one input of AND gate 158. The output of AND gate 158 provides the RD control signal to flipflop 122. The CMP and CLOCK2 signals are applied to NAND gate 160 which drives one input of AND gate 162 and one input of AND gate 164 through inverter 166. The output of AND gate 162 is applied to the second input of AND gate 158 and also inverted by inverter 168 to the second input of AND gate 164. The output of AND gate 164 is applied through delay circuit 170 to one input of AND gate 172 and also inverted by inverter 174 to the second input of AND gate 162. AND gate 172 also receives the CLOCK2 signal and provides the LD control signal at its output to flipflop 122.

The delay required by flipflop 122 may vary depending on the interval between compare phases, which depends on the availability of data words in input FIFO buffer 20, and on the number of clock cycles required to write data words into vocabulary RAM 36 during the intervening update phase. Recognizing that one flipflop 122 is required by each CAM cell in the CAM array, which typically dominates the area of the IC, it is important to minimize the number of gates in each flipflop 122. In order to retain the state of flipflop 122 for an indefinite delay, control signals RD and LD are used as an alternative to prior art multiple flipflop schemes that are controlled directly by the system clock. Flipflop 122 is a single flipflop that is able to provide an indefinite delay. By choosing control signals RD and LD to be non-overlapping and mutually exclusive the slave stage of flipflop 122 does not require refresh logic.

Figure 8:
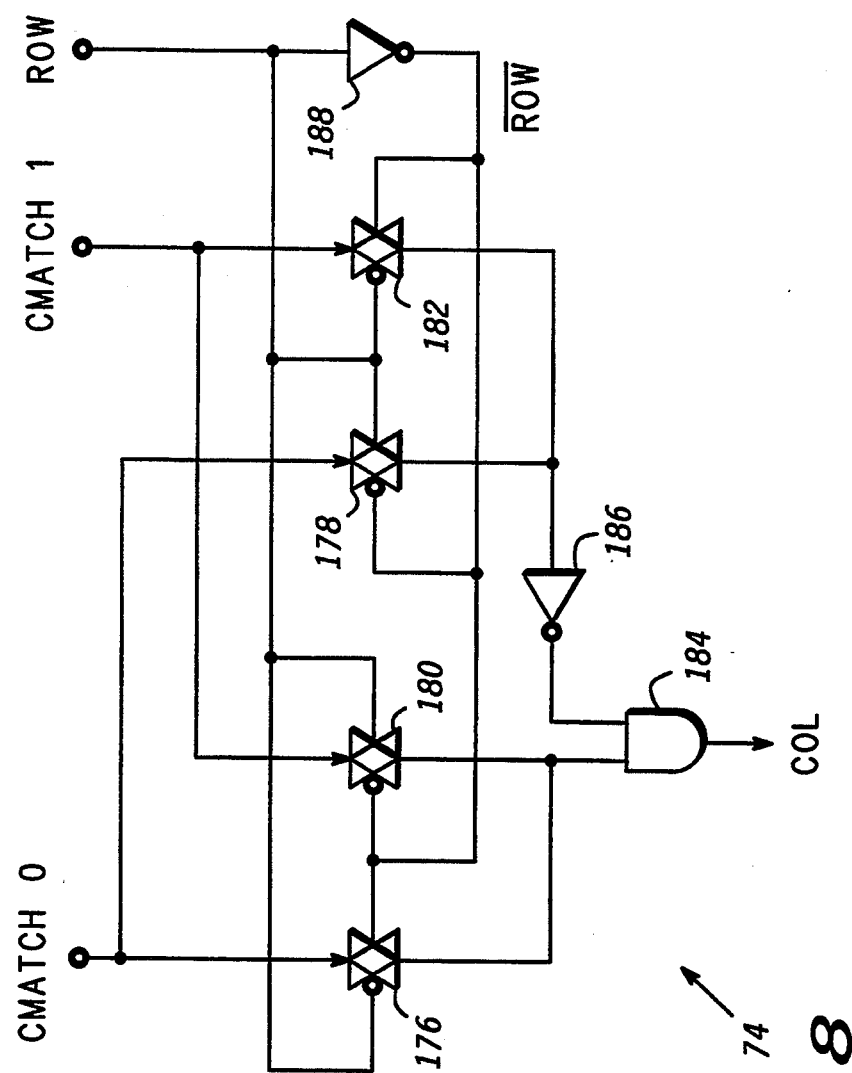
FIG. 8 is a schematic diagram illustrating the column priority encoder of FIG. 2.

Referring to FIG. 8, column priority encoder 74 is shown for the 2×2 CAM cell configuration. The CMATCH0 signal is applied to inputs of transmission gates 176 and 178. Similarly, the CMATCH1 signal is applied to inputs of transmission gates 180 and 182. The outputs of transmission gates 176 and 180 are coupled together to a first input of AND gate 184. The outputs of transmission gates 178 and 182 are coupled together through inverter 186 to a second input of AND gate 184. The ROW address controls the inverted control input of transmission gate 176 and the non-inverted control input of transmission gate 180. The ROW address also controls the inverted control input of transmission gate 182 and the non-inverted control input of transmission gate 178. The $\overline{\text{ROW}}$ address following inverter 188 controls the inverted control input of transmission gate 180 and the non-inverted control input of transmission gate 176. The $\overline{\text{ROW}}$ address also controls the inverted control input of transmission gate 178 and the non-inverted control input of transmission gate 182.

The function of priority encoder 74 is to prioritize columns in even rows, e.g. CAM cells 50–52, from least-significant cell (left-most) to most-significant cell (right-most). Priority is also given to the less significant cells, e.g. CAM cell 54, in odd rows. However in odd rows, e.g. CAM cells 54–56, the least-significant cell is right-most and the most-significant cell is left-most. Therefore, prioritization must be reversed to give priority to the less significant cells, e.g. CAM cell 54, in odd rows. The need to reverse significance from even rows to odd rows results from the serpentine configuration of the CAM cell array. The flow of cell match signals CMi wraps around from CAM cell 52 in the first row to CAM cell 54 in the second row. Thus, column priority encoder 74 reverses the physical order of its inputs for odd rows with respect to even rows by a front-end multiplexing scheme to a column priority encoder to achieve the desired priority reversal.

Consider the 2×2 CAM array arrangement supported in FIG. 8. Assume CMATCH0 and CMATCH1 are both asserted as logic zero. If ROW is logic zero and $\overline{\text{ROW}}$ is logic one, i.e. the first (even) row with CAM cells 50–52 is selected, then transmission gates 176 passes CMATCH0 to the first input of AND gate 184 and transmission gate 182 passes CMATCH1 through inverter 186 to the second input of AND gate 184. The COL address becomes logic zero giving priority to CMATCH0 because it is least significant in the first row. The column with CAM cells 50 and 56 is selected. If CMATCH0 is logic one and CMATCH1 is logic zero, AND gate 184 receives two logic ones and outputs a logic one COL, thereby selecting the column with CAM cells 52 and 54.

Now suppose ROW is logic one and $\overline{\text{ROW}}$ is logic zero, i.e. the second (odd) row with CAM cells 54–56 is selected. Again, CMATCH0 and CMATCH1 are both asserted as logic zero. Transmission gate 180 passes CMATCH1 to the first input of AND gate 184 and transmission gate 178 passes CMATCH0 through inverter 186 to the second input of AND gate 184. The COL address becomes logic zero giving priority to CMATCH1 because it is the least significant column in the second (odd) row. The column with CAM cells 52 and 54 is selected. If CMATCH0 is logic zero and CMATCH1 is logic one, AND gate 184 receives two logic ones and outputs a logic one COL, thereby selecting the column with CAM cells 50 and 56.

For larger CAM arrays, priority selected may be expanded to operate as described above. For example, AND gate 184 and inverter 186 may be replaced by Motorola part number MC14532B Column Encoder. The column inputs may be reversed by a similar front-end multiplexing scheme to a column priority encoder as shown in FIG. 8.

A common problem encountered when using separate physical vocabulary tables for data compressor 14 and data decompressor 16, e.g. for data transmission applications, is discrepancies in the vocabulary tables following power-on or reset due to an error condition. Following power-on, or reset on error, or prior to being loaded from the compressor vocabulary table stored in vocabulary RAM 36, the entire CAM array is simultaneously loaded with the reset character. Assume the reset character is defined as binary zero. The reset sequence of the CAM array may be seen in U.S. Pat. No. 5,130,993. Vocabulary RAM 36 is typically not initialized because it would be too time consuming to sequentially write the reset character to each addressable memory location. The problem arises if host controller 10 should later send a data word equal in value to the reset character to data compressor 14 while the compressor vocabulary table stored in the CAM array still contains reset characters in its unused portion. VLSM 22 would find a match in the CAM array, albeit possibly in the unused portion of the compressor vocabulary table. Data decompressor 16 cannot decompress a codeword directed to the unused portion of the decompressor vocabulary table, because it was not initialized to the reset character as was done in the compressor vocabulary table. The result would be erroneous.

As part of the present invention, data compressor 14 allows VLSM 22 to find matches of reset characters in the unused portion of the CAM array and transmit codewords directed thereto. In a first embodiment of the present invention, all locations in the unused portion of the compressor vocabulary table contain the reset character. Codewords referencing the unused portion of the compressor vocabulary table are detected by decode logic 40 on the decompressor side. Instead of looking up the character in the decompressor vocabulary table in vocabulary RAM 36 as directed by the codeword, decode logic 40 detects when it receives a codeword that references the unused portion of the decompressor vocabulary table and generates a number of reset characters equal to the length of the string match.

Figure 9:
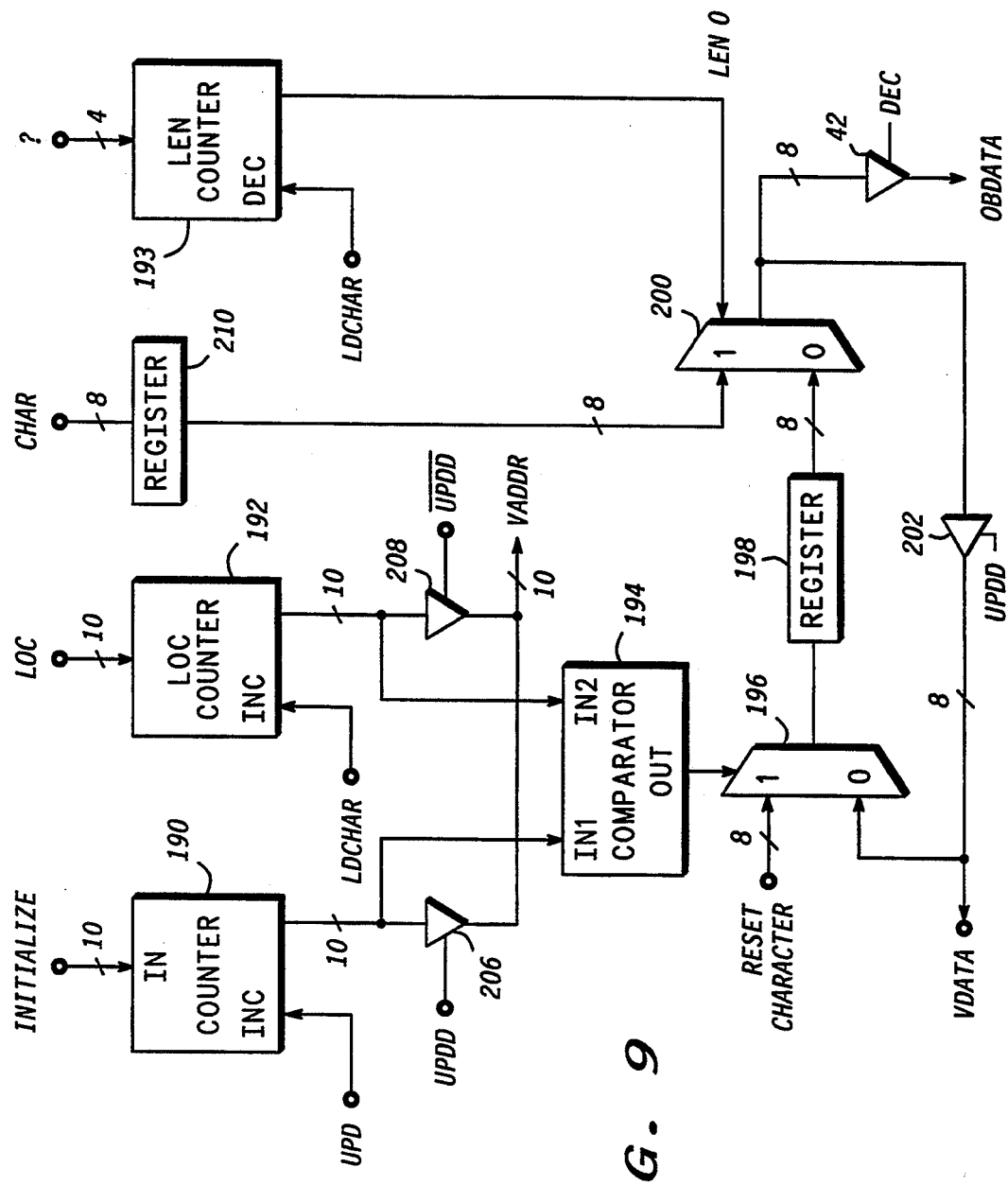
FIG. 9 is a block diagram illustrating a portion of the decode logic of FIG. 1.

The first embodiment is illustrated in FIG. 9 where decode logic 40 is shown in part including counter 190 for storing an address of the next available location in vocabulary RAM 36 in which to write data. That is, counter 190 points to the least-significant location of the unused portion of the decompressor vocabulary table. Counter 190 is initialized to zeroes by INITIALIZE following power-up or reset, or whenever the decompressor vocabulary table is otherwise reset. Counter 190 is incremented by UPD. Following a reset of the decompressor and until all of the locations in the decompressor vocabulary table have been updated with valid data words, addresses to locations in the decompressor vocabulary table which are equal to or greater than the value of counter 190 are defined to be pointing to the unused portion of the decompressor vocabulary table.

It is important that VLSM 22 prioritize the encoding of match addresses such that any matched string found in the unused portion begins with the reset character in the least-significant location of the unused portion of the compressor vocabulary table. This assures that data decompressor 16 never receives a codeword from data compressor 14 that references a location in the decompressor vocabulary table which is greater than the current value of counter 190. The used portion of the compressor vocabulary table should match the used portion of the decompressor vocabulary table.

If for example the decompressor vocabulary table contains three previously encoded history characters that differ from the reset character, and the fourth location (unused) in the compressor vocabulary tables contains the reset character, then an incoming data word equal to the reset character would produce a codeword pointing to the fourth location in the compressor vocabulary table. Thus, if data compressor 14 sent a codeword that references the fourth (unused) portion of the decompressor vocabulary table, the LOC address loaded into counter 192 would match the value in counter 190.

One aspect of the first embodiment is that the addresses of matches, including those that occur in the unused portion of the compressor vocabulary table, are priority encoded in VLSM 22 to select the least-significant address as described above. This effectively restricts the range of possible LOC values generated by encode logic 24 to the used portion of the compressor vocabulary table plus only the least-significant unused cell (containing the reset character), without the use of any match-inhibiting logic. Moreover, matches may occur in the unused portion of the compressor vocabulary table while bit packer 26 gradually increases the number of bits used to represent the location of the longest string match, e.g. from five to ten, only when needed to represent the current number of used locations in the compressor vocabulary table. It also simplifies detection of matches in the unused portion of the compressor vocabulary table, e.g. when LOC is strictly equal to least-significant unused location.

Assume a match occurs in the unused portion of the compressor vocabulary table whereby data compressor 14 generates a codeword for transmission to data decompressor 16. Bit unpacker 38 in the data decompressor 16 parses the codeword into LOC and LEN signals. The LOC address is loaded into counter 192 and LEN signal is loaded into counter 193. The outputs of counters 190 and 192 are coupled to inputs IN1 and IN2 of digital comparator 194. The output of comparator 194 provides a logic one if the input signals are equal and a logic zero otherwise. In this case, comparator 194 outputs a logic one to the control input of multiplexer 196. The logic one from comparator 194 passes the reset character through multiplexer 196 and stores the same in register 198. The output of register 198 is coupled to one input of multiplexer 200. Control signal LEN0 is logic one when LEN is zero, and is logic zero otherwise. When LEN0 is logic one, uncompressed CHAR passes through multiplexer 200. When LEN0 is logic zero, the reset character passes through multiplexer 200 and tri-state buffer 42 as OBDATA upon receiving control signal DEC. The reset character also passes through tri-state buffer 202 as VDATA upon receiving control signal UPDD from control logic (not shown) in decode logic 40 for storage in vocabulary RAM 36 to update the decompressor vocabulary table. Counter 190 provides the VADDR through tri-state buffer 206 to address vocabulary RAM 36 upon receiving control signal $\overline{\text{UPDD}}$.

Control signal UPD increments counter 190 to the next available location in vocabulary RAM 36. Recall that the codeword conveys the number of string matches as the value LEN. Control logic (not shown) in decode logic 40 increments counter 192 by pulsing control signal LDCHAR a "LEN" number of times to store the proper number of reset characters in vocabulary RAM 36 as described above. Counters 190 and 192 continue to match as each is incremented by one. Multiplexer 196 passes the second reset character into register 198. Multiplexer 200 passes the second reset character out as OBDATA and for storage in vocabulary RAM 36 for updating the decompressor vocabulary table. If LEN has value of say two, then first and second reset characters are passed out as OBDATA and updated in the decompressor vocabulary table.

Consider the case where the codeword references a valid portion of the decompressor vocabulary table. The LOC address does not match the value in counter 190. The LOC address passes through tri-state buffer 208 to provide VADDR to vocabulary RAM 36 and retrieve the corresponding character which is returned as VDATA. The output of comparator 194 goes to logic zero to enable multiplexer 196 to pass VDATA retrieved from vocabulary RAM 36 into register 198. The LEN0 signal remains logic zero to pass the contents of register 198 through tri-state buffer 42 out as OBDATA. The character is written back through tri-state buffer 202 into vocabulary RAM 36 to update the decompressor vocabulary table. Counter 190 provides VADDR which is the location to be update in the vocabulary RAM 36 when control signal $\overline{\text{UPDD}}$ is logic one.

For the case of uncompressed character sent to decode logic 40, LEN0 is logic one to pass CHAR from register 210 through multiplexer 200. The CHAR signal passes through tri-state buffer as OBDATA upon receiving control signal DEC, and also through tri-state buffer 202 to update the decompressor vocabulary table in RAM 36.

In a second embodiment of the present invention, all locations in the unused portion of the compressor vocabulary table contain the reset character and locations of matches referencing the unused portion of the compressor vocabulary table are detected by data compressor 14. The reset character is substituted therefor on the compression side. Thus, although VLSM 22 may have found a match in the unused portion of the vocabulary table, the match is preempted by encode logic 24 and an uncompressed reset character is sent instead. Data decompressor 16 handles the codeword as any other codeword that contains an uncompressed data word and thus never receives a codeword from the data compressor 14 that references the unused portion of the decompressor vocabulary table. Matched strings containing the reset character that were matched in the used portion of the compressor vocabulary table are sent as usual as codewords that do not contain the uncompressed data word.

Figure 10:
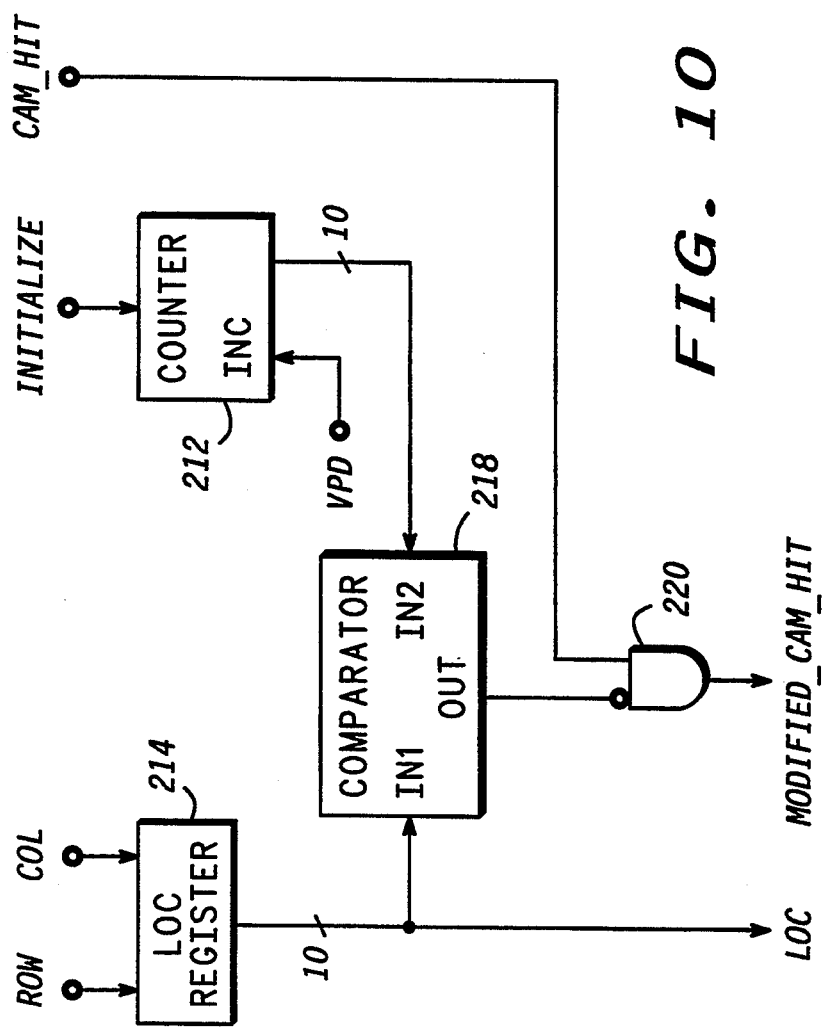
FIG. 10 is a block diagram illustrating a portion of the encode logic of FIG. 1.

The second embodiment of the present invention is illustrated in FIG. 10 where encode logic 24 is shown in part including counter 212 for storing an address of the next available location in the CAM array in which to write data words. That is, counter 212 points to the location following valid history in the compressor vocabulary table. Counter 212 is initialized to zeroes by INITIALIZE following power-up or reset, or whenever the compressor vocabulary table is reset. Counter 212 is incremented by UPD. VLSM 22 prioritizes the encoding such that any match found in the unused portion is the least-significant location of the unused portion of the compressor vocabulary table. Thus, if VLSM 22 found a match in the unused portion of the compressor vocabulary table, the LOC address loaded into register 214 would match the value in counter 212.

Assume a match occurs in the unused portion of the compressor vocabulary table whereby VLSM 22 generates a codeword for transmission to the data decompressor 16. The LOC address is loaded into register 214. The outputs of counter 212 and register are coupled to inputs IN1 and IN2 of digital comparator 218. The output of comparator 218 provides a logic one if the input signals are equal and a logic zero otherwise. In this case, comparator 218 outputs a logic one to a first inverted input of AND gate 220. Control signal CAM_HIT from VLSM 22 is coupled to a second non-inverting input of AND gate 220. The output MODIFIED_CAM_HIT of AND gate 220 is logic one only when there is a matched string that begins in the valid portion of the compressor vocabulary table.

If the LOC address does not compare with the value in counter 212, then comparator 218 outputs a logic zero causing AND gate 220 to pass CAM_HIT unchanged as MODIFIED_CAM_HIT to control logic (not shown) in encode logic 24. If VLSM 22 does not prioritize the encoding to the least-significant location, e.g. if priority encoding is provided to the most-significant location, comparator 218 must instead provide a logic one if the input IN1 is greater than or equal to input IN2 and a logic zero otherwise.

In a third embodiment of the present invention, all locations in the unused portion of the compressor vocabulary table contain the reset character and data words to be compressed that are the same as the reset character are detected by data compressor 14. The reset character is substituted therefor on the compression side. Thus, although VLSM 22 might nave found a match in either the used or the unused portion of the vocabulary table, the match is preempted by data compressor 14 and an uncompressed reset character is sent explicitly within the codeword instead. Data decompressor 16 handles the codeword as any other codeword that contains an uncompressed data word and thus never receives a codeword from the data compressor 14 that references the unused portion of the decompressor vocabulary table.

Figure 11:
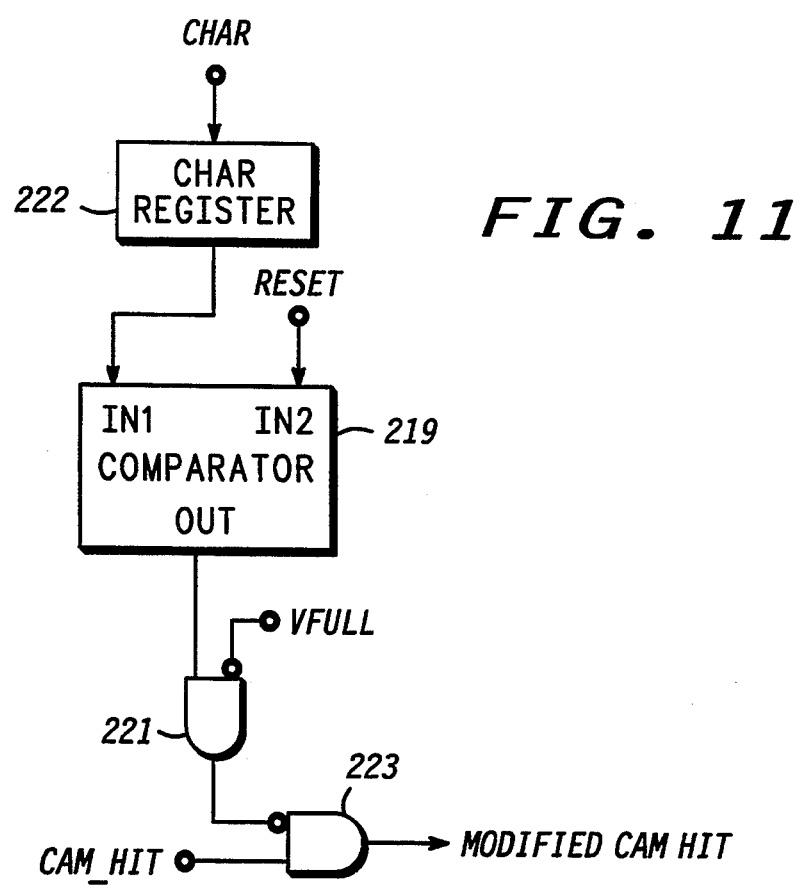
FIG. 11 is a block diagram illustrating an alternate embodiment of the portion of the encode logic.

The third embodiment of the present invention is illustrated in FIG. 11 where encode logic 24 is shown in part including CHAR register 222 for storing the uncompressed character from IBDATA. The output of register 222 is coupled to the first input IN1 of digital comparator 219. The second input IN2 to comparator 219 receives the reset character. The output of comparator 219 provides a logic one if the input signals are equal and a logic zero otherwise. In this case, comparator 219 outputs a logic one to a first non-inverted input of AND gate 221. Control signal VFULL from control logic (not shown) in encode logic 24 logic zero if compressor vocabulary table is not full and is logic one otherwise. VFULL is coupled to a second inverting input of AND gate 221. The output of AND gate 221 is coupled to a first inverting input of AND gate 223. Control signal CAM_HIT from VLSM 22 is coupled to a second non-inverting input of AND gate 223. The output MODIFIED_CAM_HIT of AND gate 223 is logic one only when the reset character appears in the input data stream and the vocabulary table is not filled.

Figure 12:
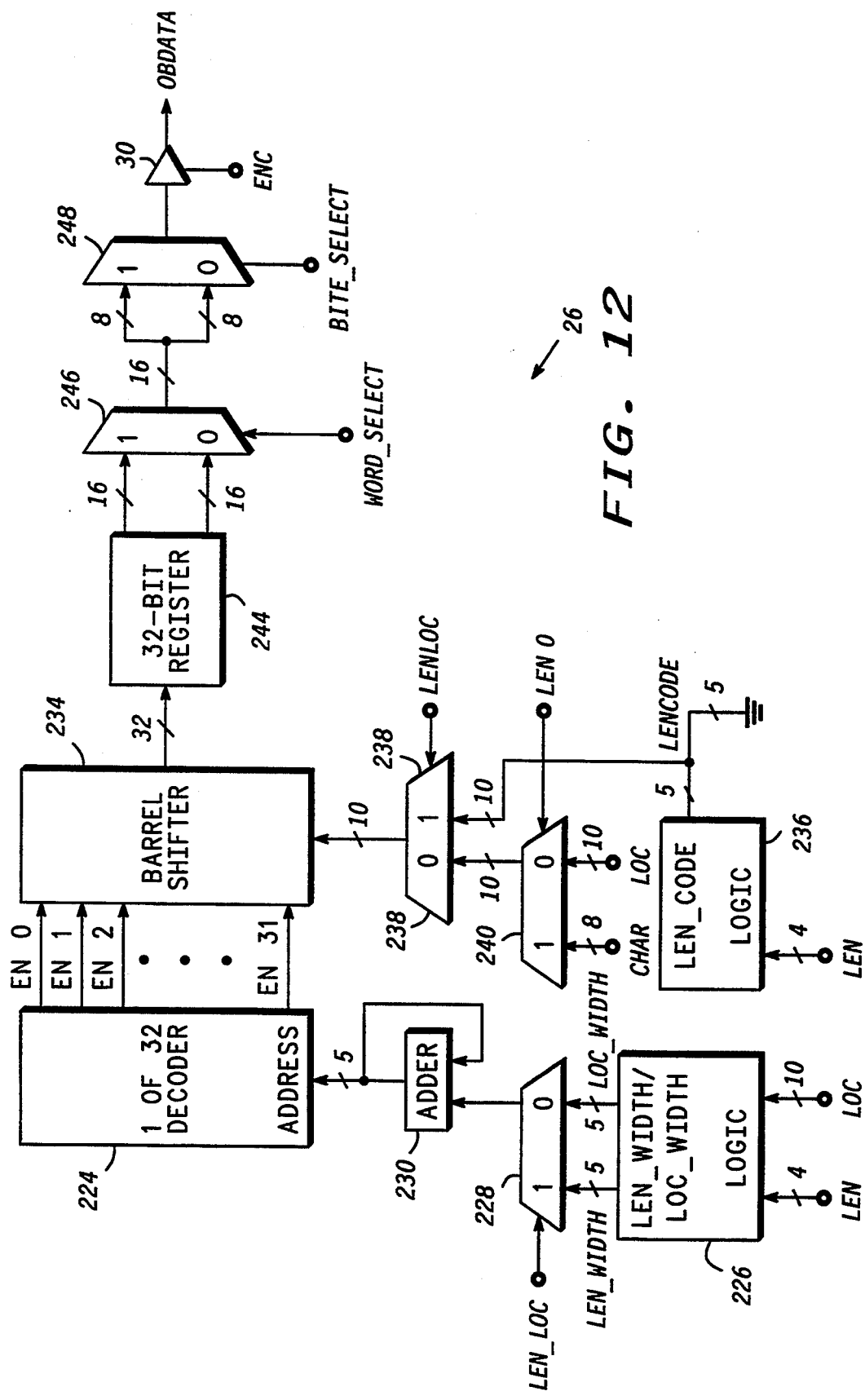
FIG. 12 is a block diagram illustrating the bit packer of FIG. 1.

Turning to FIG. 12, further detail of bit-packer 26 is shown. Bit-packer 26 packs a sequence of variable-length codewords from inputs LEN, LOC and CHAR, into a sequence of 8-bit bytes suitable for output FIFO buffer 44. Each codeword contains either a combination of variable-length location code and variable-length length code identifying the longest string match in the vocabulary table, or a length code for matches of length-zero and length-one and the uncompressed data word. Bit packer 26 packs these variable-length codewords into a sequence of 8-bit bytes and provides the final output of data compressor 14 to host controller 10 via tri-state buffer 30, output FIFO buffer 44 and host interface 12.

Decoder 224 selects one of thirty-two output enable lines ENi based on a 5-bit address. The LEN and LOC signals from encode logic 24 are converted to LOC_WIDTH and LEN_WIDTH by circuit 226 indicating the number of bits used in LOC and the number of bits used in LEN. The determination of LEN_WIDTH from LEN can be performed by a table lookup, see table 1. For example, a LEN value of zero and one requires two bits, a LEN value of two and three requires three bits, etc. The determination of LOC_WIDTH from LOC uses the well known gear shift technique. For example, circuit 226 converts the 10-bit LOC signal into LOC_WIDTH that varies in value from five to ten, depending on the number of used locations in the vocabulary table. Multiplexer 228 selects between LOC_WIDTH or LEN_WIDTH based on the state of LENLOC. A logic one LENLOC may pass LEN_WIDTH while a logic zero ELENLOC passes LOC_WIDTH to one input of adder 230. The output of adder 230 is coupled to a second input of the same to keep a running accumulation the 5-bit address signal to decoder 224. Adder 230 wraps around on overflow.

TABLE 1

| LEN | LENCODE | LEN WIDTH |
| --- | --- | --- |
| 0 | 00 | 00010 |
| 1 | 00 | 00010 |
| 2 | 001 | 00011 |
| 3 | 101 | 00011 |
| 4 | 0010 | 00100 |
| 5 | 0110 | 00100 |
| 6 | 1010 | 00100 |
| 7 | 1110 | 00100 |
| 8 | 00011 | 00101 |
| 9 | 00111 | 00101 |
| 10 | 01011 | 00101 |
| 11 | 01111 | 00101 |
| 12 | 10011 | 00101 |
| 13 | 10111 | 00101 |
| 14 | 11011 | 00101 |
| 15 | 11111 | 00101 |

The enable lines EN0, EN1 through EN31 are coupled to control inputs of barrel shifter 234. The LEN signal is converted to LENCODE by circuit 236. LENCODE is the encoded value of LEN, see table 1. If LENLOC is logic one, LENCODE passes through multiplexer 238 to the input channels of barrel shifter 234. If LENLOC is logic zero and LEN0 is logic one, CHAR passes through multiplexers 238 and 240 to the input channels of barrel shifter 234. If LENLOC is logic zero and LEN0 is logic zero, LOC passes through multiplexers 240 and 238 to the input channels of barrel shifter 234. The 32-bit output from barrel shifter 234 is coupled to 32-bit register 244. Multiplexer 246 alternately takes the upper and lower 16-bit words from register 244 under control of WORD_SELECT. The 16-bit output from multiplexer 246 is further divided into upper and lower bytes via multiplexer 248 under control of BYTE_SELECT. The output of multiplexer 248 is coupled through tri-state buffer 30 for providing OBDATA. LENLOC, LEN01, WORD_SELECT and BYTE_SELECT are routing control signals generated by control logic (not shown) in bit packer 26.

Figure 13:
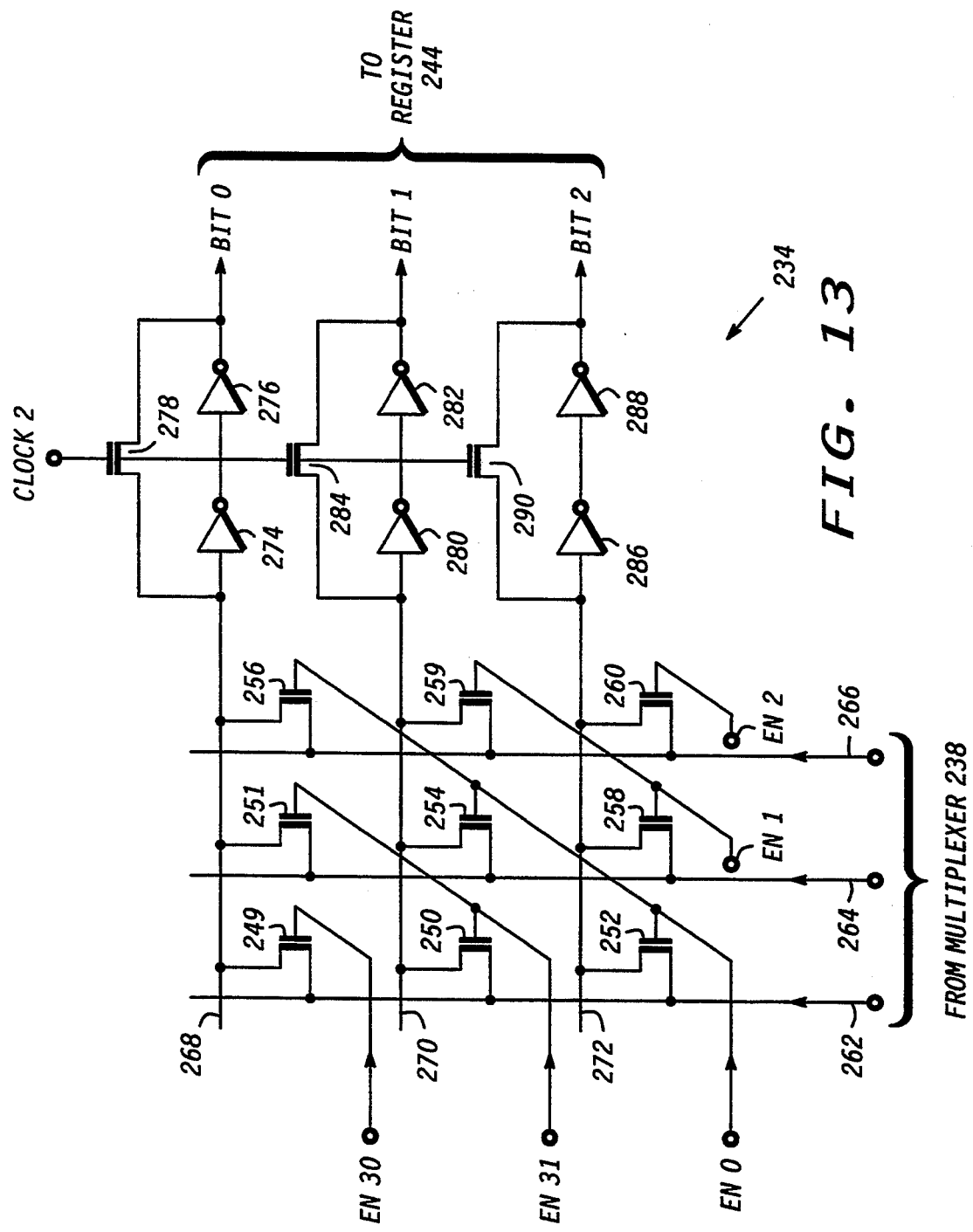
FIG. 13 is a block diagram illustrating the barrel shifter of FIG. 11.

Barrel shifter 234 is shown in part in FIG. 13 with EN30 controlling ten transistors of which only transistor 249 is shown. EN31 also controls ten transistors of which transistors 250 and 251 are shown. EN0 controls ten transistors of which transistors 252, 254 and 256 are shown. EN1 controls ten transistors of which transistors 258 and 259 are shown. The EN2 signal controls ten transistors of which only transistor 260 is shown. Transistors 249, 251 and 256 connect one of input channels 262, 264 and 266 to output channel 268 upon receiving control signal EN30, EN31 or EN0. Likewise, transistors 250, 254 and 259 connect one of input channels 262, 264 and 266 to output channel 270 upon receiving control signal EN31, EN0 or EN1. Transistors 252, 258 and 260 connect one of input channels 262, 264 and 266 to output channel 272 upon receiving control signal EN0, EN1 or EN2.

Thus, all ten input channels are translated to ten adjacent output channels of the thirty-two total output channels according to the control signal ENi. A latching circuit comprising inverters 274 and 276 and transistor 278 latches the output state of channel 268 during CLOCK2. Likewise, a latching circuit comprising inverters 280 and 282 and transistor 284 latches the output state of channel 270 during CLOCK2. A latching circuit comprising inverters 286 and 288 and transistor 290 latches the output state of channel 272 during CLOCK2. It is important that each of the twenty-two output channels that is not selected by control signal ENi, and therefore is not driven by one of the ten input channels, hold the value previously applied to the corresponding output channel. This is achieved by using latching circuits like 274-278 for all of the thirty-two output channels of barrel shifter 234.

Assume the character string "ABABC" is processed through VLSM 22 and encode logic 24. The function of bit packer 26 is to convert LEN, LOC and CHAR fields into variable-length fields and to pack them into a stream of fixed-sized 8-bit bundles. First LEN is packed by bit packer 26 and then either LOC <or CHAR is packed. The process is repeated as long as VLSM 22 compresses data words. The first data word "A" is uncompressed and requires 8-bits for the character and 2-bits for LENCODE. Although LENCODE is applied to all ten input channels of barrel shifter 234, e.g. channels 262-266 and EN0 turns on ten transistors, e.g. transistors 252-256, only the values of input channels 262 and 264 are important because they contain the LENCODE value of "00" for character "A". Nonetheless, all thirty-two output channels of barrel shifter 234 are stored in register 244. These thirty-two single-bit location in register 244 will hereafter be referred to as bit zero, bit one, bit two to bit thirty-one. The values of bits zero and one in register 244 are kept until all first sixteen bits of register 244 are filled with data and passed to output FIFO buffer 44.

Meanwhile, the LENLOC control signal enables multiplexer 228 to pass LEN_WIDTH to adder 230 representing the number of bits for LENCODE in the codeword. Adder 230 adds the LEN_WIDTH signal (two) to the previous address (zero) to enable the EN2 output of decoder 224, thereby preventing the first two bits of register 244 from being overwritten. Bit packer 26 is now ready to process LOC or CHAR and then advance the address to decoder 224 by LOC_WIDTH. During the low state of LENLOC, CHAR passes through multiplexers 238 and 240 to the input channels of barrel shifter 234. Control signal EN2 enables ten transistors e.g. transistor 260, to pass CHAR "A" to the second-through-ninth bit locations in register 244. Register 244 stores all thirty-two outputs from barrel shifter 234 but only data from bits zero to nine are of significance; the remaining bits from ten to thirty-one are don't care. LENLOC enables multiplexer 228 to pass LOC_WIDTH which has a value of eight when a character is processed, in this case "A". Adder 230 adds the previous value of two to the incoming value of eight resulting in an address of ten to decoder 224 to activate control signal EN10.

The next data word "B" follows a similar process to load the tenth and eleventh bits of register 244 with "00" and the twelfth through nineteenth bit locations with CHAR "B". At this time, adder 230 contains the value twenty and decoder 224 activates control signal EN20. Once sixteen bit locations have been filled with data, WORD_SELECT passes the upper sixteen bits to multiplexer 248 which parses it into two 8-bit bytes for transmission as OBDATA.

The next data words "AB" result in a match in the compressor vocabulary table and generate the appropriate LEN and LOC. Multiplexer 238 passes the LENCODE to the input channels of barrel shifter 234, in this case "001" for a match of length two. The LENCODE is thus placed in the twentieth through twenty-second bit locations of register 244. Logic circuit 226 determines that LEN_WIDTH is three which is added to the previous address by adder 230. The address to decoder 224 becomes twenty-three. LOC passes through multiplexers 240 and 238 to the input channel of barrel shifter 234. The EN23 control signal enables barrel shifter 234 to translate LOC to the twenty-third through twenty-seventh bit locations in register 244. The LOC_WIDTH is set to value five because the compressor vocabulary table is not filled above the thirty-second bit location. The address to decoder 224 is updated to twenty-eight. The data word "C" takes the next ten bit locations in register 244. Note register 244 wraps around to its first bit location when full. Multiplexer 246 selects the lower 16-bit word in register 244 when full and sends it out through multiplexer 248 as OBDATA. The variable length codewords have thus been transmitted as fixed length data words.

Figure 14:
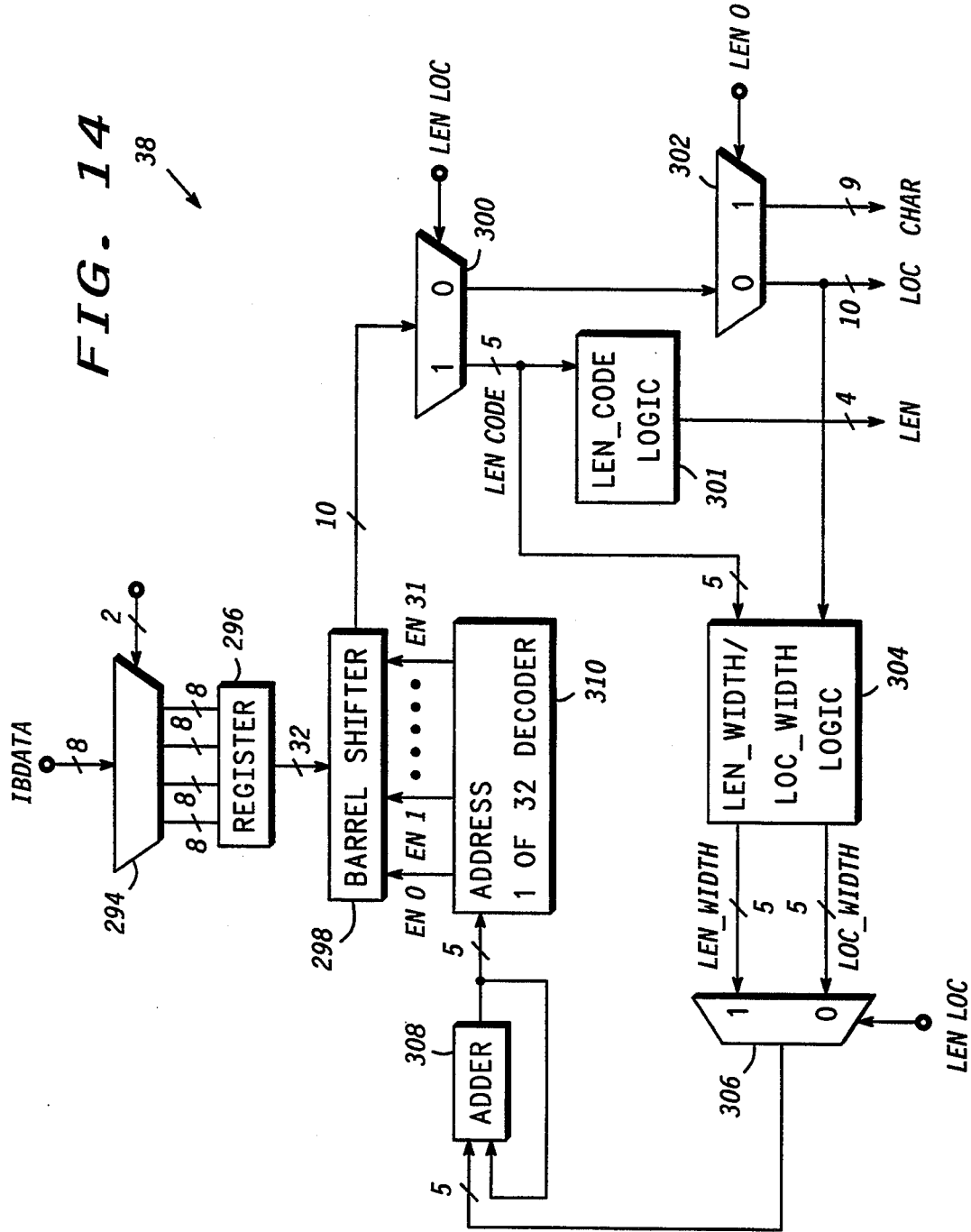
FIG. 14 is a block diagram illustrating the bit unpacker of FIG. 1.

Turning to FIG. 14, bit-unpacker 38 receives IBDATA contained compressed data words. Multiplexer 294 sequentially places the 8-bit IBDATA signal into 32-bit register 296 which outputs a 32-bit signal to barrel shifter 298. Barrel shifter 298 follows a similar construction described in FIG. 13 for barrel shifter 234. The ten output channels from barrel shifter 298 pass through multiplexer 300 under control of LENLOC and become LENCODE or pass to multiplexer 302. The LENCODE signal is converted to a fixed-length LEN signal by lencode logic 301 according to Table 1. The outputs from multiplexer 302 provide CHAR and LOC. The LEN and LOC signals are converted to LOC_WIDTH and LEN_WIDTH by circuit 304 indicating the number of bits used in LOC and the number of bits used in LEN. Multiplexer 306 alternately passes LEN_WIDTH and LOC_WIDTH to adder 308 under control of LENLOC. Adder 308 increments its current address by the value of LEN_WIDTH or LOC_WIDTH. The address into decoder 310 selects one of thirty-two enable lines ENi to control barrel shifter 298.

Bit-unpacker 38 parses the incoming compressed 8-bit IBDATA into a sequence of alternating length and location codes or length codes and uncompressed data words. It decodes the variable-length codes and alternately generates fixed-length fields LEN and LOC, or LEN and CHAR. The LEN_WIDTH and LOC_WIDTH increment the adder address and activate the proper enable lines ENi for barrel shifter 298 to translate the packed fields. For example, the first data word sent in the above illustration was "A". The initial address from adder 308 is set to zero. Thus, the least significant ten lines from register 296 are translated through barrel shifter 298 to multiplexer 300. The logic one LENLOC control signal passes LENCODE to lencode logic 301 and to logic circuit 304. Lencode logic 301 converts LENCODE, "00" in this case, into zero LEN. Logic circuit 304 converts LENCODE to LEN_WIDTH, which advances the address into decoder 310 by two.

Barrel shifter 298 has thirty-two input channels and ten output channels. All ten output channels are always driven by ten adjacent input channels of the thirty-two total input channels according to the control signal ENi. Thus barrel shifter 298 in bit unpacker 38 does not require the latching circuits present in barrel shifter 234 in bit packer 26.

Decoder 310 activates control signal EN2 for barrel shifter 298 to translate the second through ninth bit locations of register 296 to the input of multiplexer 300, providing character "A". The LOC signal passes when LENLOC is logic zero. Because LEN equals zero, LEN0 is logic one and CHAR is passed through multiplexer 302 to decode logic 40, to tri-state buffer 42 and to output FIFO buffer 44. The address of decoder 310 enables EN10 to barrel shifter 298. The next codeword, conveying data word "B" is decoded similarly to the process of decoding the data word "A". After the decoding of the codeword conveying data word "B", the address to decoder 310 is twenty thereby enabling EN20. The codeword is parsed in a way for LENCODE to be decoded as "101", passed through multiplexer 300 and generates a LEN value from lencode logic 301. LEN_WIDTH equal three is determined in logic circuit 304 and the address to decoder 310 is advanced by three to enable EN23. When LENLOC is again logic zero, LOC is translated to the output of barrel shifter 298, referencing location zero, which is the starting location of matched string "AB" in the decompressor vocabulary table. LOC_WIDTH is determined in logic circuit 304 to advance the address of decoder 310 to twenty-eight, obtained by adding five to the current address twenty-three. Therefore, EN28 is enabled and the codeword conveying the character "C" is passed to the output of barrel shifter 298. Each time a byte is read from register 296 to barrel shifter 298, a new byte from IBDATA is written into a location in register 296 selected by multiplexer 294.

In summary, the present invention allows compression and decompression of data following the resetting of vocabulary tables including matches to the unused area of the compressor vocabulary table.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit, comprising:
   a first counter for storing and incrementing a first address value;
   a second counter for storing and incrementing a second address value;
   a comparator having first and second inputs receiving said first and second address values respectively and having an output providing a first control signal;
   a first multiplexer having first and second inputs, a control input and an output, said first input receiving a first data signal, said second input receiving a second data signal, said control input being coupled to said output of said comparator, said output passing said first data signal upon receiving a first state of said first control signal and said second data signal upon receiving a second state of said first control signal.

2. A method of detecting a first address signal out a CAM array, comprising the steps of:
   storing a first address value;
   storing a second address value;
   comparing said first and second address values and providing a first control signal having a first state when said first and second address values are equal and a second state otherwise; and
   selecting between first and second data signals based on said first control signal where said first state of said first control signal selects said first data signal and second state of said first control signal selects said second data signal.

* * * * *